(12) United States Patent
Watanabe et al.

(10) Patent No.: US 9,331,295 B2
(45) Date of Patent: May 3, 2016

(54) FILM-FORMING INK, FILM-FORMING METHOD, METHOD OF MANUFACTURING LIGHT EMITTING ELEMENT, LIGHT EMITTING ELEMENT, LIGHT EMITTING DEVICE, AND ELECTRONIC APPARATUS

(71) Applicant: SEIKO EPSON CORPORATION, Tokyo (JP)

(72) Inventors: Shotaro Watanabe, Chino (JP); Hiroshi Takiguchi, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 61 days.

(21) Appl. No.: 13/715,428

(22) Filed: Dec. 14, 2012

(65) Prior Publication Data

US 2013/0153873 A1  Jun. 20, 2013

(30) Foreign Application Priority Data

Dec. 20, 2011  (JP) .................................. 2011-278881
Dec. 20, 2011  (JP) .................................. 2011-278882

(51) Int. Cl.
*H01L 51/56* (2006.01)
*B05D 3/02* (2006.01)
(Continued)

(52) U.S. Cl.
CPC ............ *H01L 51/50* (2013.01); *H01L 51/0007* (2013.01); *H01L 51/0005* (2013.01); *H01L 51/0037* (2013.01); *H01L 51/0039* (2013.01); *H01L 51/0042* (2013.01); *H01L 51/0043* (2013.01); *H01L 51/0085* (2013.01);
(Continued)

(58) Field of Classification Search
CPC ............................. H01L 51/0032; C08K 5/06
USPC ............... 257/40, E51.04, E51.041–E51.044, 257/E51.027–E51.029, E51.03, 257/E51.031–E51.039; 252/500; 428/690, 428/917; 524/366; 523/160
See application file for complete search history.

(56) References Cited

U.S. PATENT DOCUMENTS 5,091,004 A * 2/1992 Tabayashi et al. .......... 106/31.57
6,627,364 B2 * 9/2003 Kiguchi et al. .................... 430/7
6,630,017 B2 * 10/2003 Ma et al. ..................... 106/31.59
(Continued)

FOREIGN PATENT DOCUMENTS

JP  A-2006-348287  12/2006
JP  A-2008-77958   4/2008
(Continued)

OTHER PUBLICATIONS

Baldo et al., "Highly efficient phosphorescent emission from organic electroluminescent devices," Nature, 1998, vol. 395, pp. 151-154.
(Continued)

*Primary Examiner* — Vu A Nguyen
(74) *Attorney, Agent, or Firm* — Oliff PLC

(57) ABSTRACT

A film-forming ink according to an embodiment of the invention includes a film-forming material; and a liquid medium which dissolves or disperses the film-forming material, in which the liquid medium contains an ether compound represented by Formula (I).

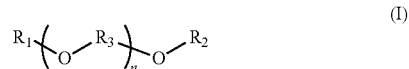

12 Claims, 11 Drawing Sheets

(51) Int. Cl.
 *H01L 51/50* (2006.01)
 *H01L 51/00* (2006.01)

(52) U.S. Cl.
 CPC .............. *H01L51/5056* (2013.01); *H01L 51/56* (2013.01); *H01L 2251/308* (2013.01)

(56) References Cited

U.S. PATENT DOCUMENTS

| | | | |
|---|---|---|---|
| 7,462,405 B2 * | 12/2008 | Royster et al. | 428/690 |
| 2007/0123607 A1 * | 5/2007 | King et al. | 523/160 |
| 2007/0167538 A1 * | 7/2007 | Mochizuki et al. | 523/160 |
| 2009/0102365 A1 | 4/2009 | Takemoto et al. | |
| 2009/0103284 A1 | 4/2009 | Suzuki et al. | |
| 2009/0256117 A1 * | 10/2009 | Seshadri et al. | 252/500 |

FOREIGN PATENT DOCUMENTS

| | | |
|---|---|---|
| JP | A-2009-272588 | 11/2009 |
| JP | A-2009-277602 | 11/2009 |
| JP | 2010-080058 A | 4/2010 |
| JP | A-2010-206120 | 9/2010 |
| JP | A-2011-171243 | 9/2011 |

OTHER PUBLICATIONS

Baldo et al., "Very high-efficiency green organic light-emitting devices based on electrophosphorescence," Applied Physics Letters, 1999, vol. 75, No. 1, pp. 4-6.

Baldo et al., "High-efficiency fluorescent organic light-emitting devices using a phosphorescent sensitizer," Nature, 2000, vol. 403, pp. 750-752.

* cited by examiner

FILM-FORMING INK, FILM-FORMING METHOD, METHOD OF MANUFACTURING LIGHT EMITTING ELEMENT, LIGHT EMITTING ELEMENT, LIGHT EMITTING DEVICE, AND ELECTRONIC APPARATUS

BACKGROUND

1. Technical Field

The present invention relates to a film-forming ink, a film-forming method, a method of manufacturing a light emitting element, a light emitting element, a light emitting device, and an electronic apparatus.

2. Related Art

Organic electroluminescence elements (organic EL elements) are light emitting elements having a structure in which at least one organic light emitting layer (light emitting layer) is interposed between an anode and a cathode. In such light emitting elements, by applying an electric field between a cathode and an anode, electrons are injected from the cathode and holes are injected from the anode, to a light emitting layer; the electrons and the holes are recombined in the light emitting layer to generate excitons; and when these excitons return to the ground state, the corresponding amount of energy is emitted as light.

In general, in the organic EL elements, a hole injection layer is provided on a anode and a hole transport layer or a light emitting layer is provided on the hole injection layer.

As a method of forming these layers (film-forming method), a method using a film-forming ink in which a film-forming material is dissolved or dispersed is known (for example, refer to JP-A-2008-77958).

In such a film-forming method, since patterning is possible without using photolithography, there is an advantage in that manufacturing processes are simple and the amount of raw materials used is small.

In general, as a constituent material of the respective layers of the organic EL elements, a π-conjugated compound is used. In the related art, the respective layers of the organic EL elements are formed using a film-forming ink in which the π-conjugated compound as a film-forming material is dissolved in an aromatic hydrocarbon solvent.

However, in the film-forming ink of the related art, the aromatic hydrocarbon solvent interacts with the film-forming material to cause π-π stacking, which leads to gelation and an increase in viscosity. Therefore, there is problem in that preservation stability is lacking.

In addition, in the film-forming ink of the related art, in addition to the interaction causing the above-described π-π stacking, since the solvent has a high boiling point, a desolvation property is low. As a result, there is a problem in that the characteristics of the obtained organic EL element deteriorate. When a film is formed using a liquid droplet discharge method, the above-described problems become significant because a force to prevent aggregation between π-conjugated compounds does not work unlike a spin coating method and thus the π-conjugated compounds easily aggregate.

In addition, when a light emitting layer is formed using a film-forming ink which contains a phosphorescent light emitting material formed of a metal complex, with a film-forming ink of the related art, the above-described problems relating to preservation stability and a deterioration in the characteristics of an organic EL element become significant. The reason is considered to be that a bond between a metal of a metal complex and a ligand is unstable due to effects of dissolved oxygen and water in a solvent.

In addition, in a film-forming ink of the related art using a non-aqueous solvent or dispersion medium, a contact angle with respect to a hole injection layer, which is formed using an aqueous solvent or dispersion medium, is large (that is, wettability is low). Therefore, there is a problem in that the film-forming ink does not wet and is not spread out on the hole injection layer sufficiently.

In order to avoid the above-described problems, JP-A-2008-77958 discloses a configuration of adding a surfactant to a solvent or a dispersion medium. However, this configuration is not practical because the surfactant remaining in the obtained film deteriorates the characteristics of a light emitting element.

SUMMARY

An advantage of some aspects of the invention can be realized in the following forms or application examples.

Such an advantage is achieved in the following aspects.

According to a first aspect of the invention, there is provided a film-forming ink including: a film-forming material; and a liquid medium which dissolves or disperses the film-forming material, in which the liquid medium contains an ether compound represented by Formula (I).

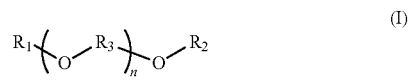

(I)

In Formula (I), $R_1$ and $R_2$ each independently represent a linear alkyl group, a branched alkyl group, or a cyclic alkyl group which has 1 to 4 carbon atoms. $R_3$ represents an alkylene group having 1 to 3 carbon atoms. In addition, n represents an integer of 0 to 4. In addition, when n is 2 or more, $R_3$'s may be the same as or different from each other.

According to the film-forming ink configured as above, when the film-forming material contains π-conjugated compounds, an ether compound, which is not aromatic but aliphatic, is interposed between the π-conjugated compounds. Therefore, π-conjugated compounds can be prevented from aggregating due to π-π stacking.

As a result, even when the film-forming material contains π-conjugated compounds, the film-forming ink according to the first aspect has superior preservation stability and a superior desolvation property (or a superior dispersion-medium-removal property).

In addition, the film-forming ink according to the first aspect has a superior desolvation property or a superior dispersion-medium-removal property. Therefore, the liquid medium can be prevented or suppressed from remaining in the obtained film. As a result, a film having superior film quality can be formed.

In particular, in the ether compound used in the film-forming ink according to the first aspect, the number of ether oxygen atoms and the number of carbon atoms are optimized and heteroatoms other than ether oxygen atoms are not included (that is, a polar group (for example, ester, acetate, ketone, a hydroxyl group, a carboxyl group, or a sulfo group) other than an ether group is not included). Therefore, the ether compound can be used as a non-aqueous solvent or dispersion medium, and even when the ether compound remains in the obtained film, an adverse effect on the electrical characteristics of the film can be reduced. Furthermore, such a compound has less aggressiveness with respect to the film-forming material. From this point of view, a deterioration in the characteristics of the obtained film can be prevented.

Furthermore, when the film-forming material contains a metal complex, an ether oxygen atom is coordinated to a metal of the metal complex. Therefore, effects of dissolved oxygen and water in a solvent or dispersion medium on a bond between the metal of the metal complex and a ligand can be alleviated. Therefore, even when the film-forming material contains a metal complex, the film-forming ink according to the first aspect has superior preservation stability and thus a film having superior film quality can be formed.

In the film-forming ink according to the first aspect, it is preferable that the liquid medium have a surface tension of 35 dyn/cm or less.

According to the film-forming ink configured as above, even when a non-aqueous solvent or dispersion medium is used, the film-forming ink can easily wet and be spread out on a layer (film) which is formed using an aqueous solvent or dispersion medium.

In addition, in the film-forming ink configured as above, it is not necessary that an additive such as a surfactant be used. Therefore, a deterioration in the characteristics of the obtained film due to an additive remaining in the film can be prevented.

In the film-forming ink according to the first aspect, it is preferable that, in Formula (I), n represent 2 to 4.

As a result, the preservation stability of the film-forming ink can be further improved. In addition, both of the wettability of the film-forming ink on a layer (film) which is formed using an aqueous solvent or dispersion medium; and the desolvation property or dispersion-medium-removal property of the film-forming ink, can be improved. In addition, the excessive lowering of a boiling point of the liquid medium (ether compound) can be prevented. As a result, for example, when a liquid droplet discharge method is used, nozzles of a liquid droplet discharge head can be prevented from clogging.

In the film-forming ink according to the first aspect, it is preferable that, in Formula (I), the number of carbon atoms in $R_3$ be 2 or 3.

As a result, when the film-forming material is soluble in a non-aqueous solvent, the film-forming material can be reliably dissolved in the liquid medium and an unintended material (for example, a member constituting a liquid droplet discharge head used for a liquid droplet discharge method) can be prevented or suppressed from being dissolved in the liquid medium.

In the film-forming ink according to the first aspect, it is preferable that a content of the ether compound in the liquid medium be 0.1 wt % to 100 wt %.

As a result, the preservation stability of the film-forming ink can be further improved. In addition, the wettability of the film-forming ink on a layer (film) which is formed using an aqueous solvent or dispersion medium can also be improved.

In the film-forming ink according to the first aspect, it is preferable that the film-forming material contain a π-conjugated compound.

As a result, film-forming materials (π-conjugated compounds) can be prevented from aggregating due to π-π stacking.

In the film-forming ink according to the first aspect, it is preferable that the film-forming material contain a metal complex.

As a result, effects of dissolved oxygen and water in a solvent or dispersion medium on a bond between a metal of the film-forming material (metal complex) and a ligand can be alleviated.

In the film-forming ink according to the first aspect, it is preferable that the liquid medium contain an aromatic hydrocarbon compound in addition to the ether compound.

As a result, when the film-forming material is soluble in a non-aqueous solvent, the film-forming material can be reliably dissolved in the liquid medium; and furthermore, when the film-forming ink is manufactured, a liquid medium having a desired surface tension can be easily prepared according to a mixing ratio of the ether compound and the aromatic hydrocarbon compound.

In the film-forming ink according to the first aspect, it is preferable that the film-forming material be soluble in a non-aqueous solvent.

Such a film-forming material can be dissolved in a liquid medium.

In the film-forming ink according to the first aspect, it is preferable that the film-forming material be a material constituting an organic layer of an organic electroluminescence element, or a precursor thereof.

In general, as a constituent material of an organic layer of organic EL elements, a π-conjugated compound is used. Therefore, by using the film-forming ink according to the first aspect, the characteristics of an organic EL element can be further improved.

In the film-forming ink according to the first aspect, it is preferable that the film-forming ink be used for forming a film, formed of the film-forming material as the major component, by being applied to a substrate and removing the liquid solvent.

As a result, a target film or a precursor film thereof can be formed.

In the film-forming ink according to the first aspect, it is preferable that the film-forming ink be used for forming a film with a liquid droplet discharge method.

As a result, even in a small region, the film-forming ink can be applied to a desired position and area. In addition, the liquid droplet discharge method has an advantage compared to a vapor deposition method, in that manufacturing processes are simple and the amount of raw materials (film-forming materials) used can be reduced.

In addition, in the liquid droplet discharge method, when a π-conjugated compound is used as a film-forming material, π-conjugated compounds easily aggregate due to π-π stacking. Therefore, an effect obtained by applying the liquid droplet discharge method to the film-forming ink according to the first aspect, is remarkable.

According to a second aspect of the invention, there is provided a film-forming method including: applying the above-described film-forming ink to a substrate; and removing the liquid medium from the film-forming ink to form a film.

According to the film-forming method, a film having superior film quality can be formed.

According to a third aspect of the invention, there is provided a method of manufacturing a light emitting element including: applying the above-described film-forming ink to a substrate; and removing the liquid medium from the film-forming ink to form an organic layer.

According to the method of manufacturing a light emitting element, an organic layer (for example, a hole transport layer, a light emitting layer, or an interlayer) having superior film quality can be formed.

According to a fourth aspect of the invention, there is provided a light emitting element which is manufactured using the above-described manufacturing method.

As a result, a light emitting element having superior light emitting characteristics can be provided at low cost.

According to a fifth aspect of the invention, there is provided a light emitting device including the above-described light emitting element.

As a result, a light emitting device having superior light emitting characteristics can be provided at low cost.

According to a sixth aspect of the invention, there is provided an electronic apparatus including the above-described light emitting device.

As a result, an electronic apparatus having superior reliability can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a film-forming ink, an film-forming method, a method of manufacturing a light emitting element, a light emitting element, a light emitting device, and an electronic apparatus according to preferred embodiments of the invention will be described with reference to the accompanying drawings.

First Embodiment
Light Emitting Element

Figure 1:
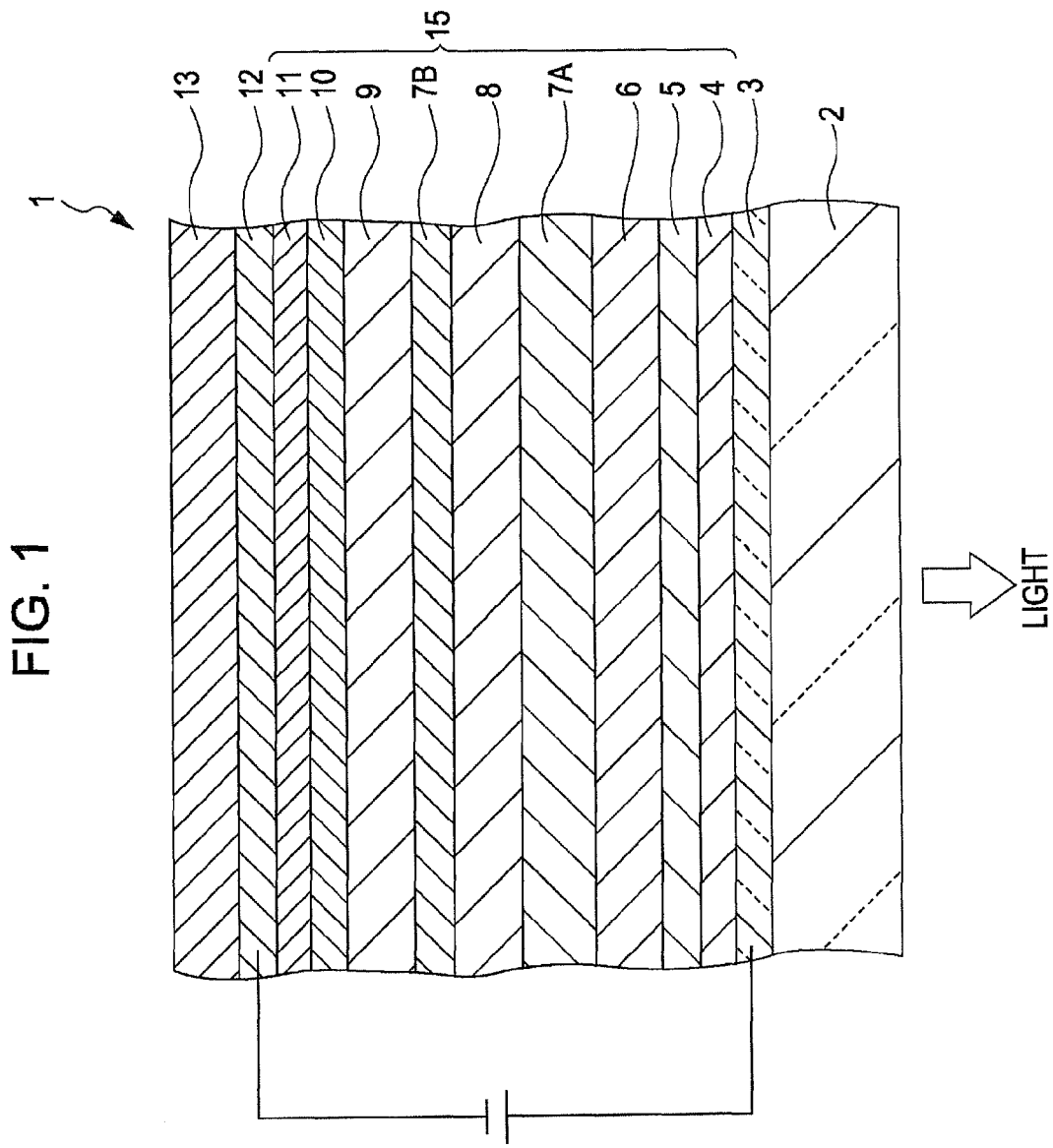
FIG. 1 is a cross-sectional view schematically illustrating a light emitting element according to an embodiment of the invention.

FIG. 1 is a cross-sectional view schematically illustrating a light emitting element according to an embodiment of the invention. Hereinafter, for convenience of description, the upper side and lower side of FIG. 1 are considered as "up" and "down" respectively.

A light emitting element (electroluminescence element) 1 illustrated in FIG. 1 emits red light (R), green light (G), and blue light (B) to emit white light.

In such a light emitting element 1, between an anode 3 and a cathode 12, a hole injection layer 4, a hole transport layer 5, a red-light emitting layer (first light emitting layer) 6, a first interlayer 7A, a blue-light emitting layer (second light emitting layer) 8, a second interlayer 7B, a green-light emitting layer (third light emitting layer) 9, an electron transport layer 10, and an electron injection layer 11 are laminated in this order.

In other words, the light emitting element 1 has a configuration in which a laminate 15 is interposed between the two electrodes (between the anode 3 and the cathode 12), the laminate 15 being obtained by laminating the hole injection layer 4, the hole transport layer 5, the red-light emitting layer 6, the first interlayer 7A, the blue-light emitting layer 8, the second interlayer 7B, the green-light emitting layer 9, the electron transport layer 10, and the electron injection layer 11 in this order.

At least one of the layers (organic layers) configuring the laminate 15 is formed using a film-forming ink and a film-forming method according to an embodiment of the invention described below. In general, as a constituent material of an organic layer of organic EL elements, a π-conjugated compound is used. Therefore, by using a film-forming ink according to an embodiment of the invention, the characteristics of an organic EL element can be improved.

The light emitting element 1 is provided on a substrate 2 as a whole and is sealed with a sealing member 13.

In such a light emitting element 1, electrons are supplied (injected) from the cathode 12 and holes are supplied (injected) from the anode 3, to the respective light emitting layers including the red-light emitting layer 6, the blue-light emitting layer 8, and the green-light emitting layer 9. In each of the light emitting layers, holes and electrons are recombined. Excitons are generated by energy which is emitted at the time of this recombination, and when the excitons return to the ground state, energy (fluorescence and phosphorescence) is emitted. As a result, the red-light emitting layer 6, the blue-light emitting layer 8, and the green-light emitting layer 9 emit red light, blue light, and green light, respectively. As a result, the light emitting element 1 emits white light.

The substrate 2 supports the anode 3. Since the light emitting element 1 according to this embodiment has a structure of extracting light from the side of the substrate 2 (bottom emission type), the substrate 2 and the anode 3 are substantially transparent (colorless and transparent, colored and transparent, or semi-transparent).

Examples of a constituent material of the substrate 2 include resin materials such as polyethylene terephthalate, polyethylene naphthalate, polypropylene, cycloolefin polymer, polyamide, polyethersulfone, polymethyl methacrylate, polycarbonate, and polyarylate; and glass materials such as fused quartz and soda glass. Among these, one kind or a combination of two or more kinds can be used.

The average thickness of such a substrate 2 is not particularly limited, and is preferably about 0.1 mm to 30 mm and more preferably 0.1 mm to 10 mm.

When the light emitting element 1 has a structure of extracting light from the opposite side to the substrate 2 (top emission type), either a transparent substrate or an opaque substrate can be used as the substrate 2.

Examples of the opaque substrate include substrates made of ceramic materials such as alumina; substrates in which an oxide film (insulating film) is formed on a surface of a metal substrate made of stainless steel or the like; and substrates made of resin materials.

Hereinafter, the respective portions of the light emitting element 1 will be described in order.

Anode

The anode 3 is an electrode which injects holes into the hole transport layer 5 through the hole injection layer 4 described below. As a constituent material of such an anode 3, a material having a large work function and superior conductivity is preferably used.

Examples of the constituent material of the anode 3 include oxides such as ITO (Indium Tin Oxide), IZO (Indium Zinc Oxide), $In_2O_3$, $SnO_2$, Sb-containing $SnO_2$, and Al-containing ZnO; and Au, Pt, Ag, and Cu, and alloys thereof. Among these, one kind or a combination of two or more kinds can be used.

The average thickness of such an anode 3 is not particularly limited, and is preferably about 10 nm to 200 nm and more preferably about 50 to 150 nm.

Cathode

On the other hand, the cathode 12 is an electrode which injects electrons into the electron transport layer 10 through the electron injection layer 11 described below. As a constituent material of such a cathode 12, a material having a small work function is preferably used.

Examples of the constituent material of the cathode 12 include Li, Mg, Ca, Sr, La, Ce, Er, Eu, Sc, Y, Yb, Ag, Cu, Al, Cs, and Rb, and alloys thereof. Among these, one kind or a combination of two or more kinds (for example, a laminate of multiple layers) can be used.

In particular, when the alloy is used as the constituent material of the cathode 12, an alloy including a stable metal element such as Ag, Al, or Cu, specifically, an alloy such as MgAg, AlLi, or CuLi is preferably used. By using such an alloy as the constituent material of the cathode 12, the electron injection efficiency and the stability of the cathode 12 can be improved.

The average thickness of such a cathode 12 is not particularly limited, and is preferably about 100 to 10,000 nm and more preferably about 200 to 500 nm.

Since the light emitting element 1 according to this embodiment is the bottom emission type, the cathode 12 does not necessarily have light permeability.

Hole Injection Layer

The hole injection layer 4 has a function of improving the hole injection efficiency of the anode 3.

Such an hole injection layer 4 may be formed using an aqueous solvent or dispersion medium-based film-forming ink, as described below.

A constituent material of such an hole injection layer 4 (hole injection material) is not particularly limited, and examples thereof include poly(3,4-ethylenedioxythiophene)/poly(styrenesulfonate) (PEDOT/PSS), PEDOT/PSS/Nafion (trade name), polythiophene and derivatives thereof, polyaniline and derivatives thereof, polypyrrole and derivatives thereof, and N,N,N',N'-tetraphenyl-p-diaminobenzene and derivatives thereof. Among these, one kind or a combination of two or more kinds can be used.

The average thickness of such a hole injection layer 4 is not particularly limited, and is preferably about 5 nm to 150 nm and more preferably about 10 nm to 100 nm.

Hole Transport Layer

The hole transport layer 5 has a function of transporting holes, injected from the anode 3 through the hole injection layer 4, to the red-light emitting layer 6.

As a constituent material of such an hole transport layer 5, various p-type high molecular weight materials or various p-type low molecular weight materials can be used alone or in a combination of two or more kinds.

Examples of the p-type high molecular weight materials (organic polymers) include materials having an arylamine skeleton such as polyarylamines including poly(2,7-(9,9-di-n-octylfluorene)-(1,4-phenylene-((4-sec-butylphenyl)imino)-1,4-phenylene (TFB); materials having a fluorene skeleton such as a fluorene-bithiophene copolymer; materials having both of an arylamine skeleton and a fluorene skeleton such as a fluorene-arylamine copolymer; and poly(N-vinylcarbazole), polyvinyl pyrene, polyvinyl anthracene, polythiophene, polyalkylthiophene, polyhexylthiophene, poly(p-phenylene vinylene), polythienylene vinylene, pyrene formaldehyde resin, ethylcarbazole formaldehyde resin and derivatives thereof.

These p-type high molecular weight materials can be used as a mixture with other compounds. An example of a mixture containing polythiophene includes poly(3,4-ethylenedioxythiophene)/poly(styrenesulfonate) (PEDOT/PSS).

On the other hand, examples of the p-type low molecular weight materials include arylcycloalkane-based compounds such as 1,1-bis(4-di-para-triaminophenyl)cyclohexane and 1,1'-bis(4-di-para-tolylaminophenyl)-4-phenyl-cyclohexane; arylamine-based compounds such as 4,4',4"-trimethyltriphenylamine, N,N,N',N'-tetraphenyl-1,1'-biphenyl-4,4'-diamine, N,N'-diphenyl-N,N'-bis(3-methylphenyl)-1,1'-biphenyl-4,4'-diamine (TPD1), N,N'-diphenyl-N,N'-bis(4-methoxyphenyl)-1,1'-biphenyl-4,4'-diamine (TPD2), N,N,N',N'-tetrakis(4-methoxyphenyl)-1,1'-biphenyl-4,4'-diamine (TPD3), and N,N'-bis(1-naphthyl)-N,N'-diphenyl-1,1'-biphenyl-4,4'-diamine (α-NPD), and TPTE; phenylenediamine-based compounds such as N,N,N',N'-tetraphenyl-para-phenylenediamine, N,N,N',N'-tetra(para-tolyl)-para-phenylenediamine, and N,N,N',N'-tetra(meta-tolyl)-meta-phenylenediamine (PDA); carbazole-based compounds such as carbazole, N-isopropylcarbazole, and N-phenylcarbazole; stilbene-based compounds such as stilbene and 4-di-para-tolylaminostilbene; oxazole-based compounds such as $O_xZ$; triphenylmethane-based compounds such as triphenylmethane and m-MTDATA; pyrazoline-based compounds such as 1-phenyl-3-(para-dimethylaminophenyl)pyrazoline; benzine(cyclohexadiene)-based compounds; triazole-based compounds such as triazole; imidazole-based compounds such as imidazole; oxadiazole-based compounds such as 1,3,4-oxadiazole and 2,5-di(4-dimethylaminophenyl)-1,3,4-oxadiazole; anthracene-based compounds such as anthracene and 9-(4-diethylaminostyryl)anthracene; fluorenone-based compounds such as fluorenone, 2,4,7-trinitro-9-fluorenone, and 2,7-bis(2-hydroxy-3-(2-chlorophenylcarbamoyl)-1-naphthylazo)fluorenone; aniline-based compounds such as polyaniline; silane-based compounds; pyrrole-based compounds such as 1,4-dithioketo-3,6-diphenyl-pyrrolo-(3,4-c)pyrrolopyrrole; fluorene-based compounds such as fluorene; porphyrin-based compounds such as porphyrin and metal tetraphenylporphyrin; quinacridone-based compounds such as quinacridone; metallic or non-metallic phthalocyanine-based compounds such as phthalocyanine, copper phthalocyanine, tetra(t-butyl)copper phthalocyanine, and iron phthalocyanine; metallic or non-metallic naphthalocyanine-based compounds such as copper naphthalocyanine, vanadyl naphthalocyanine, and monochlorogallium naphthalocyanine; and benzidine-based compounds such as N,N'-di(naphthalene-1-yl)-N,N'-diphenyl-benzidine and N,N,N',N'-tetraphenylbenzidine.

The average thickness of such an hole transport layer 5 is not particularly limited, and is preferably about 10 nm to 150 nm and more preferably about 10 nm to 100 nm.

In addition, the hole transport layer 5 is not necessarily provided.

Red-Light Emitting Layer

The red-light emitting layer (first light emitting layer) 6 includes a red-light emitting material which emits red light (first color). When the above-described hole transport layer 5 is not provided or when the hole transport layer 5 is formed using an aqueous solvent or dispersion medium-based film-forming ink, the red-light emitting layer 6 is formed using a film-forming ink and a film-forming method according to an embodiment of the invention described below.

Such a red-light emitting material is not particularly limited, and various kinds of red fluorescent materials and red phosphorescent materials can be used alone or in combination with two or more kinds.

The red fluorescent materials are not particularly limited as long as they emit red fluorescent light, and examples thereof include perylene derivatives, europium complexes, benzopyran derivatives, rhodamine derivatives, benzothioxanthene derivatives, porphyrin derivatives, Nile red, 2-(1,1-dimethylethyl)-6-(2-(2,3,6,7-tetrahydro-1,1,7,7-tetramethyl-1H,5H-benzo[ij]quinolizine-9-yl)ethenyl]-4H-pyran-4H-ylidene) propanedinitrile (DCJTB), 4-(dicyanomethylene)-2-methyl-6-(p-dimethylaminostyryl)-4H-pyran (DCM), poly[2-methoxy-5-(2-ethylhexyloxy)-1,4-(1-cyanovinylenephenylene)], poly[{9,9-dihexyl-2,7-bis(1-cyanovinylene)fluorenylene}ortho-co-{2,5-bis(N,N'-diphenylamino)-1,4-phenylene}], and poly[{2-methoxy-5-(2-ethylhexyloxy)-1,4-(1-cyanovinylenephenylene)}-co-{2,5-bis(N,N'-diphenylamino)-1,4-phenylene}].

The red phosphorescent materials are not particularly limited as long as they emit red phosphorescent light, and examples thereof include complexes of metals such as iridium, ruthenium, platinum, osmium, rhenium, and palladium, of which at least one of the ligands thereof has a phenylpyridine, bipyridyl, and porphyrin skeleton. Specific examples thereof include tris(1-phenylisoquinoline)iridium, bis[2-(2'-benzo[4,5-a]thienyl)pyridinate-N, C$^{3'}$]iridium (acetylacetonate) (btp2Ir(acac)), 2,3,7,8,12,13,17,18-octaethyl-12H,23H-porphyrin-platinum (II), bis[2-(2'-benzo[4,5-α]thienyl)pyridinate-N,C$^{3'}$]iridium, and bis(2-phenylpyridine)iridium(acetylacetonate).

In addition to the red-light emitting material, the red-light emitting layer 6 may include a host material to which a red-light emitting material is added as a guest material.

The host material has a function of recombining holes and electrons to generate excitons and transferring the energy of the excitons to the red-light emitting material (Foerster or Dexter transfer) to excite the red-light emitting material. When such a host material is used, the host material can be doped with, for example, the red-light emitting material, which is the guest material, as a dopant for use.

Such a host material is not particularly limited as long as it has the above-described function for a red-light emitting material used. When the red-light emitting material includes a red fluorescent material, examples thereof include acene derivatives (acene-based materials) such as naphthacene derivatives, naphthalene derivatives, and anthracene derivatives; quinolinolate-based metal complexes such as sdistyrylarylene derivatives, perylene derivatives, distyrylbenzene derivatives, distyrylamine derivatives, and tris(8-quinolinolate)aluminum complexes (Alq$_3$); triarylamine derivatives such as tetramers of triphenylamine; oxadiazole derivatives; silole derivatives; dicarbazole derivatives; oligothiophene derivatives; benzopyran derivatives; triazole derivatives; benzoxazole derivatives; benzothiazole derivatives; quinoline derivatives; and 4,4'-bis(2,2'-diphenylvinyl)biphenyl (DPVBi). Among these, one kind or a combination of two or more kinds can be used.

When the red-light emitting material (guest material) and the host material described above are used, the content of the red-light emitting material (amount doped) in the red-light emitting layer 6 is preferably 0.01 wt % to 10 wt % and more preferably 0.1 wt % to 5 wt %. By setting the content of the red-light emitting material within such a range, light emitting efficiency can be optimized.

The average thickness of such a red-light emitting layer 6 is not particularly limited, and is preferably about 10 nm to 150 nm and more preferably 10 nm to 100 nm.

First Interlayer

The first interlayer 7A is provided between the red-light emitting layer 6 and the blue-light emitting layer 8 described below so as to be in contact therewith. The first interlayer 7A, practically, does not include a material having a light emitting property and has a function of adjusting the transfer of carriers (holes and electrons) between the red-light emitting layer (first light emitting layer) 6 and the blue-light emitting layer (second light emitting layer) 8. Due to this function, the red-light emitting layer 6 and the blue-light emitting layer 8 efficiently emit light, respectively.

A constituent material of such a first interlayer 7A is not particularly limited as long as it has the above-described function of adjusting the transfer of carriers, but acene-based materials and amine-based materials are preferably used.

The acene-based materials are not particularly limited as long as they have an acene skeleton and the above-described function, and examples thereof include naphthalene derivatives, anthracene derivatives, tetracene (naphthacene) derivatives, pentacene derivatives, hexacene derivatives, and heptacene derivatives. Among these, one kind or a combination of two or kinds can be used.

The amine-based materials used for the first interlayer 7A are not particularly limited as long as they have an amine skeleton and the above-described function. For example, materials having an amine skeleton among the above-described hole transport materials can be used and benzidine-based amine derivatives are preferably used.

In addition, the average thickness of the first interlayer 7A is not particularly limited, and is preferably 1 nm to 100 nm, more preferably 3 nm to 50 nm, and still more preferably 5 nm to 30 nm. As a result, while suppressing drive voltage, the first interlayer 7A can reliably adjust the transfer of holes and electrons between the red-light emitting layer 6 and the blue-light emitting layer 8.

The first interlayer 7A is not necessarily provided.

Blue-Light Emitting Layer

The blue-light emitting layer (second light emitting layer) 8 includes a blue-light emitting material which emits blue light (second color).

Examples of such a blue-light emitting material include various kinds of blue fluorescent materials and blue phosphorescent materials. Among these, one kind or a combination with two or more kinds can be used.

The blue fluorescent materials are not particularly limited as long as they emit blue fluorescent light, and examples thereof include distyrylamine derivatives such as distyryldiamine-based compounds, fluoranthene derivatives, pyrene derivatives, perylene and perylene derivatives, anthracene derivatives, benzoxazole derivatives, benzothiazole derivatives, benzoimidazole derivatives, chrysene derivatives, phenanthrene derivatives, distyrylbenzene derivatives, tetraphenylbutadiene, 4,4'-bis(9-ethyl-3-carbazovinylene)-1,1'-biphenyl (BCzVBi), poly[9,9-dioctylfluoren-2,7-diyl)-co-(2,5-dimethoxybenzen-1,4-diyl)], poly[(9,9-dihexyloxyfluoren-2,7-diyl)-ortho-co-[2-methoxy-5-{2-ethoxyhexyloxy}phenylen-1,4-diyl]], and poly[(9,9-dioctylfluoren-2,7-diyl)-co-(ethynylbenzene)].

The blue phosphorescent materials are not particularly limited as long as they emit blue phosphorescent light, and examples thereof include complexes of metals such as iridium, ruthenium, platinum, osmium, rhenium, and palladium. Specific examples thereof include bis(4,6-difluorophenylpyridinate-N,$C^{2'}$)-picolinate-iridium, tris[2-(2,4-difluorophenyl)pyridinate-N,$C^{2'}$]iridium, bis[2-(3,5-trifluoromethyl)pyridinate-N,$C^{2'}$]-picolinate-iridium, and bis(4,6-difluorophenylpyridinate-N,$C^{2'}$) iridium (acetylacetonate).

In addition to the blue-light emitting material, the blue-light emitting layer 8 may include a host material to which a blue-light emitting material is added as a guest material.

As such a host material, the same host materials as those described above in the description of the red-light emitting layer (first light emitting layer) 6 can be used.

Second Interlayer

The second interlayer 7B is provided between the blue-light emitting layer 8 and the green-light emitting layer 9 described below so as to be in contact therewith. The second interlayer 7B, practically, does not include a material having a light emitting property and has a function of adjusting the transfer of carriers (holes and electrons) between the blue-light emitting layer (second light emitting layer) 8 and the green-light emitting layer (third light emitting layer) 9. This function can prevent the transfer of the energy of excitons between the blue-light emitting layer 8 and the green-light emitting layer 9, respectively. Therefore, the transfer of energy from the blue-light emitting layer 8 to the green-light emitting layer 9 is suppressed and thus the blue-light emitting layer 8 and the green-light emitting layer 9 efficiently emit light, respectively.

A constituent material of such a second interlayer 7B is not particularly limited as long as the second interlayer 7B includes the same or the same kind of material as at least either the host material of the blue-light emitting layer 8 or the host material of the green-light emitting layer 9; practically, does not include a material having a light emitting property; and has the above-described function of adjusting the transfer of carriers. It is preferable that the same or the same kind of material as the host material include an acene-based material.

As such an acene-based material, the same acene-based materials as those described above in the description of the first interlayer 7A can be used.

In addition, the thickness of the second interlayer 7B is not particularly limited, and is preferably about 2 nm to 10 nm and more preferably 3 nm to 7 nm.

By setting the thickness of the second interlayer 7B in the above-described range, the diffusion of excitons (holes and electrons) can be suppressed or prevented and the transfer of excitons can be reliably adjusted.

The second interlayer 7B is not necessarily provided.

Green-Light Emitting Layer

The green-light emitting layer (third light emitting layer) 9 includes a green-light emitting material which emits green light (third color).

Such a green-light emitting material is not particularly limited, and examples thereof include various kinds of green fluorescent materials and green phosphorescent materials. Among these, one kind or a combination with two or more kinds can be used.

The green fluorescent materials are not particularly limited as long as they emit green fluorescent light, and examples thereof include coumarin derivatives, quinacridone and derivatives thereof, 9,10-bis[(9-ethyl-3-carbazole)-vinylenyl]-anthracene, poly(9,9-dihexyl-2,7-vinylenefluorenylene), poly[(9,9-dioctylfluorene-2,7-diyl)-co-(1,4-diphenylene-vinylene-2-methoxy-5-{2-ethylhexyloxy}benzene)], and poly[(9,9-dioctyl-2,7-divinylenefluorenylene)-ortho-co-(2-methoxy-5-(2-ethoxylhexyloxy)-1,4-phenylene)].

The green phosphorescent materials are not particularly limited as long as they emit green phosphorescent light, and examples thereof include complexes of metals of iridium, ruthenium, platinum, osmium, rhenium, and palladium. Specific examples thereof include fac-tris(2-phenylpyridine)iridium (Ir(ppy)$_3$), bis(2-phenylpyridinate-N,$C^{2'}$)iridium (acetylacetonate), and fac-tris[5-fluoro-2-(5-trifluoromethyl-2-pyridine)phenyl-C,N]iridium.

In addition to the green-light emitting material, the green-light emitting layer 9 may include a host material to which a green-light emitting material is added as a guest material.

As such a host material, the same host materials as those described above in the description of the red-light emitting layer (first light emitting layer) 6 can be used.

Electron Transport Layer

The electron transport layer 10 has a function of transporting electrons, which are injected from the cathode 12 through the electron injection layer 11, to the green-light emitting layer 9.

Examples of a constituent material (electron transport material) of the electron transport layer 10 include quinoline derivatives of organometallic complexes and the like including 8-quinolinol or derivatives thereof, such as tris(8-quinolinolate)aluminum (Alq$_3$), as a ligand; oxadiazole derivatives; perylene derivatives; pyridine derivatives; pyrimidine derivatives; quinoxaline derivatives; diphenylquinone derivatives; and nitro-substituted fluorene derivatives. Among these, one kind or a combination of two or more kind can be used.

The average thickness of the electron transport layer 10 is not particularly limited, and is preferably about 0.5 nm to 100 nm and more preferably about 1 nm to 50 nm.

The electron transport layer 10 is not necessarily provided.

Electron Injection Layer

The electron injection layer 11 has a function of improving the electron injection efficiency from the cathode 12.

Examples of a constituent material (electron injection material) of the electron injection layer 11 include various inorganic insulating materials and various inorganic semiconductor materials.

Examples of such inorganic insulating materials include alkali metal chalcogenides (oxides, sulfates, selenides, and tellurides), alkaline earth metal chalcogenides, alkali metal halides, and alkaline earth metal halides. Among these, one kind or a combination of two or more kinds can be used. By configuring the electron injection layer with these materials as the major component, an electron injecting property can be improved. In particular, alkali metal compounds (alkali metal chalcogenides, alkali metal halides, and the like) have a small work function, and by configuring the electron injection layer 11 using the alkali metal compounds, the light emitting element 1 can obtain a high luminance.

Examples of the alkali metal chalcogenides include $Li_2O$, LiO, $Na_2S$, $Na_2Se$, and NaO.

Examples of the alkaline earth metal chalcogenides include CaO, BaO, SrO, BeO, BaS, MgO, and CaSe.

Examples of the alkali metal halides include CsF, LiF, NaF, KF, LiCl, KCl, and NaCl.

Examples of the alkaline earth metal halides include $CaF_2$, $BaF_2$, $SrF_2$, $MgF_2$, and $BeF_2$.

In addition, examples of the inorganic semiconductor materials include oxides, nitrides, and oxide-nitrides which contain at least one element of Li, Na, Ba, Ca, Sr, Yb, Al, Ga, In, Cd, Mg, Si, Ta, Sb, and Zn. Among these, one kind or a combination of two or more kinds can be used.

The average thickness of the electron injection layer 11 is not particularly limited, and is preferably about 0.1 nm to 1000 nm, more preferably about 0.2 nm to 100 nm, and still more preferably about 0.2 nm to 50 nm.

The electron injection layer 11 is not necessarily provided.

Sealing Member

The sealing member 13 is provided so as to cover the cathode 12 and has a function of airtightly sealing the anode 3, the laminate 15, and the cathode 12 to block oxygen and water. By providing the sealing member 13, effects of improving the reliability of the light emitting element 1 and preventing the light emitting element 1 from being changed and deteriorating (improving durability) and the like can be obtained.

Examples of a constituent material of the sealing member 13 include Al, Au, Cr, Nb, Ta, Ti, or alloys including these, silicon oxide, and various resin materials. When a conductive material is used as the constituent material of the sealing member 13, in order to avoid short-circuit, it is preferable that an insulating film be provided between the sealing member 13 and the cathode 12, as necessary.

In addition, the sealing member 13, which is plate-like, may be opposed to the substrate 2 and a sealing material, such as a thermosetting resin, may be sealed therebetween.

Method of Manufacturing Light Emitting Element

Next, a film-forming ink and a film-forming method according to an embodiment of the invention will be described using a case of application to the manufacture of the above-described light emitting element 1, as an example. Hereinafter, a case of manufacturing the hole transport layer 5 using the film-forming ink and the film-forming method according to the embodiments will be described as a representative example.

The above-described light emitting element 1 can be manufactured, for example, as follows.

[1] First, the substrate 2 is prepared and the anode 3 is formed on this substrate 2.

The anode 3 can be formed using, for example, a chemical vapor deposition (CVD) method such as plasma CVD and thermal CVD, a dry plating method such as vacuum deposition, a wet plating method such as electrolytic plating, a thermal spraying method, a sol-gel method, an MOD method, or the junction of metal foils.

[2] Next, the hole injection layer 4 is formed on the anode 3.

The hole injection layer 4 is formed through a gas phase process using, for example, a CVD method or a dry plating method such as vacuum deposition or sputtering.

In addition, the hole injection layer 4 can be formed by supplying a hole-injection-layer-forming material (ink), obtained by dissolving or dispersing the hole injection material in a solvent or in a dispersion medium, onto the anode 3 and drying the resultant (removing the solvent or the dispersion medium).

Examples of a method of supplying the hole-injection-layer-forming material include various coating methods such as a spin coating method, a roll coating method, and an ink jet printing method (liquid droplet discharge method). By using such a coating method, the hole injection layer 4 can be relatively easily formed.

Examples of the solvent or the dispersion medium, used for the preparation of the hole-injection-layer-forming material, include various inorganic solvents, various organic solvents, and mixed solvents including the above-described solvents.

In addition, in order to stabilize the discharge of liquid droplets, a solvent having a high boiling point can be added to such a solvent or dispersion medium. Specific examples of such a solvent having a high boiling point include aromatic hydrocarbons, isopropyl alcohol (IPA), n-butanol, γ-butyrolactone, N-methylpyrrolidone (NMP), dimethyl formamide (DMF), hexamethyl phosphoramide (HMPA), dimethyl sulfoxide (DMSO), 1,3-dimethyl-2-imidazolidinone (DMI), and derivatives thereof; and glycol ethers such as carbitol acetate and butyl carbitol acetate Drying can be performed by leaving to stand under the atmospheric pressure or reduced pressure, heat treatment, blowing of inert gas, or the like.

In addition, prior to this process, an upper surface of the anode 3 may be treated with oxygen plasma. As a result, for example, a lyophilic property can be imparted to the upper surface of the anode 3, organic materials attached onto the upper surface of the anode 3 can be removed, and the work function in the vicinity of the upper surface of the anode 3 can be adjusted.

It is preferable that the conditions of the oxygen plasma treatment be set as follows: for example, a plasma power of about 100 W to 800 W, an oxygen gas flow rate of about 50 mL/min to 100 mL/min, a transport speed of a treatment target member (anode 3) of about 0.5 mm/sec to 10 mm/sec, and a temperature of a support, which supports the treatment target member, of about 70° C. to 90° C.

[3] Next, the hole transport layer 5 is formed on the hole injection layer 4.

The hole transport layer 5 can be formed by supplying a hole-transport-layer-forming material (the film-forming ink according to the embodiment), obtained by dissolving or dispersing the hole transport material in a solvent or in a dispersion medium, onto the hole injection layer 4 and drying the resultant (removing the solvent or the dispersion medium).

Examples of a method of supplying the hole-transport-layer-forming material (the film-forming ink) include an ink jet printing method (liquid droplet discharge method) using a liquid droplet discharging device described below.

Liquid Droplet Discharging Device

A liquid droplet discharging device used for forming the hole transport layer 5 will be described.

Figure 2:
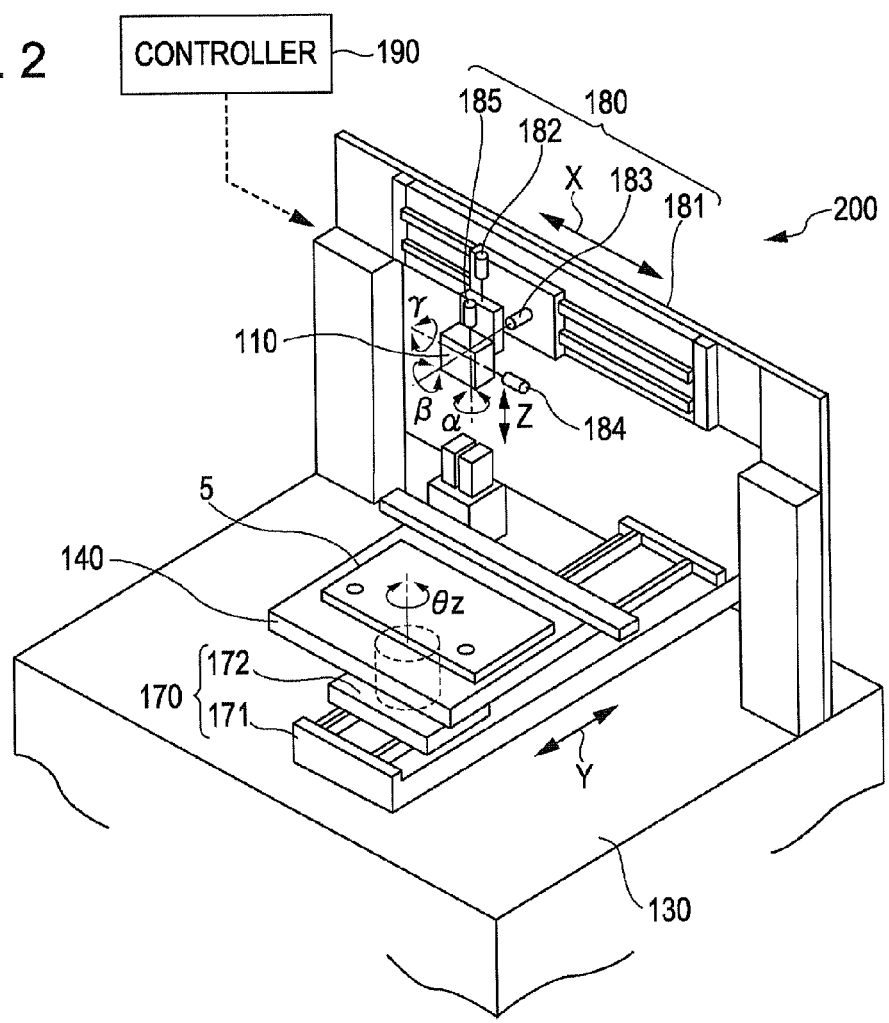
FIG. 2 is a perspective view schematically illustrating a configuration of a liquid droplet discharging device.
Figure 3:
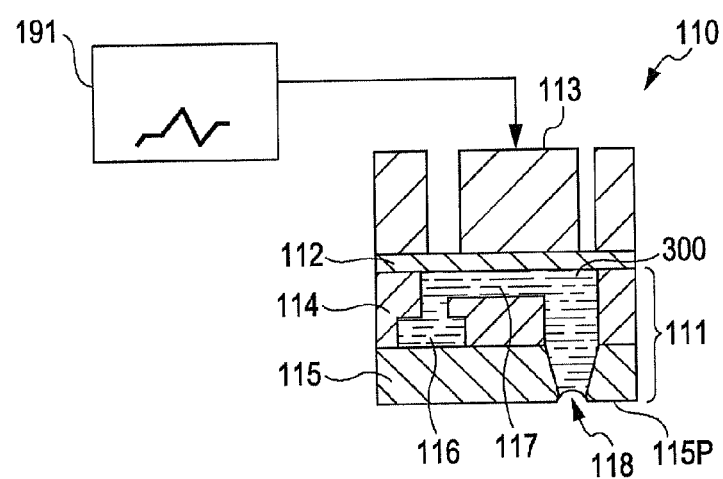
FIG. 3 is a diagram schematically illustrating a configuration of a liquid droplet discharge head provided in the liquid droplet discharge device of FIG. 2.

FIG. 2 is a perspective view schematically illustrating an example of a liquid droplet discharging device (ink jet apparatus) according to a preferred embodiment. FIG. 3 is a diagram schematically illustrating a configuration of a liquid droplet discharge head (ink jet head) provided in the liquid droplet discharge device of FIG. 2.

As illustrated in FIG. 2, a liquid droplet discharging device 200 includes a liquid droplet discharge head (ink jet head; hereinafter, simply referred to as the head) 110, a base 130, a table 140, a ink tank (not illustrated), a table positioning unit 170, a head positioning unit 180, and a controller 190.

The base 130 is a plate which supports the respective components of the liquid droplet discharging device 200, such as the table 140, the table positioning unit 170, and the head positioning unit 180.

The table 140 is provided over the base 130 via the table positioning unit 170. In addition, on the table 140, a substrate S (in this embodiment, a laminate including the substrate 20, the anode 3, and the hole injection layer 4) is placed.

In addition, on the rear surface of the table 140, a rubber heater (not illustrated) is arranged. The entire upper surface of the substrate S, placed on the table 140, is heated to a predetermined temperature by the rubber heater.

The table positioning unit 170 includes a first moving unit 171 and a motor 172. The table positioning unit 170 positions the table 140 on the base 130 and thus the substrate S is positioned on the base 130.

The first moving unit 171 includes two rails which are provided to be parallel to the Y direction and a support which moves on the rails. The support of the first moving unit 171 supports the table 140 through the motor 172. By the support moving the rails, the table 140, on which the substrate S is placed, moves in the Y direction to be positioned.

The motor 172 supports the table 140, and swings the table 140 in the $\theta_z$ direction to be positioned.

The head positioning unit 180 includes a second moving unit 181, a linear motor 182, and motors 183, 184, and 185. The head positioning unit 180 positions the head 110.

The second moving unit 181 includes two support columns which are vertically provided on the base 130, a rail mounting which is provided between and by the two support columns and has two rails, and a support member (not illustrated) which supports the head 110 so as to move along the rails. By the support member moving along the rails, the head 110 moves in the X direction to be positioned.

The linear motor 182 is positioned in the vicinity of the support member and can move the head 110 in the Z direction and to be positioned.

The motors 183, 184, and 185 swings the head 110 in the α, β, and γ directions, respectively, to be positioned.

Using the table positioning unit 170 and the head positioning unit 180 described above, a liquid droplet discharging device 200 accurately controls the relative positions and orientations between an ink discharge surface 115P of the head 110 and the substrate S on the table 140.

As illustrated in FIG. 3, the head 110 discharges a film-forming ink 300 from a nozzle (discharge portion) 118 with a ink jet method (liquid droplet discharge method). In this embodiment, the head 110 adopts a piezoelectric method of discharging ink using a piezoelectric element 113 as a piezoelectric element. The piezoelectric method has an advantage of not affecting the composition of materials because heat is not applied to the film-forming ink 300.

The head 110 includes a head body 111, a vibration plate 112, and the piezoelectric element 113.

The head body 111 has a main body 114 and a nozzle plate 115 which is positioned on a lower surface of the main body 114. By interposing the main body 114 between the nozzle plate 115 and the vibration plate 112, a reservoir 116 as a space and plural ink chambers 117, which are branched from the reservoir 116, are formed.

The film-forming ink 300 is supplied from the ink tank (not illustrated) to the reservoir 116. In the reservoir 116, flow paths for supplying the film-forming ink 300 to the respective ink chambers 117 are formed.

In addition, the nozzle plate 115 is mounted onto the lower surface of the main body 114 and configures the ink discharge surface 115P. This nozzle plate 115 has the plural nozzles 118 which discharge the film-forming ink 300 and are openings corresponding to the respective ink chambers 117. The ink flow paths are formed from the respective ink chambers 117 to the corresponding nozzles (discharge portions) 118.

The vibration plate 112 is mounted onto an upper surface of the head body 111 and configures a wall surface of the respective ink chambers 117. The vibration plate 112 can vibrate in response to the vibration of the piezoelectric element 113.

The piezoelectric element 113 is provided on the opposite side to the head body 111 of the vibration plate 112 so as to correspond to the respective ink chambers 117. The piezoelectric element 113 is obtained by interposing a piezoelectric material, such as crystal, between a pair of electrodes (not illustrated). The pair of electrodes are connected to a drive circuit 191.

When an electric signal is input to the piezoelectric element 113 from the drive circuit 191, the piezoelectric element 113 expands or contracts. When the piezoelectric element 113 contracts, the pressure of the ink chambers 117 is reduced and the film-forming ink 300 is caused to flow from the reservoir 116 to the ink chambers 117. In addition, when the piezoelectric element 113 expands, the pressure of the ink chambers 117 increase and the film-forming ink 300 is discharged from the nozzles 118. By changing the applied voltage, the amount of the piezoelectric element 113 deformed can be controlled. In addition, by controlling the frequency of the applied voltage, the deformation rate of the piezoelectric element 113 can be controlled. That is, by changing the voltage to be applied to the piezoelectric element 113, the discharge conditions of the film-forming ink 300 can be controlled.

The controller 190 controls the respective components of the liquid droplet discharging device 200. For example, the controller 190 controls a position of the substrate S to which the film-forming ink 300 is discharged, for example, by adjusting the waveform of the applied voltage, generated by the drive circuit 191, to control the discharge conditions of the film-forming ink 300 or by controlling the head positioning unit 180 and the table positioning unit 170.

Film-Forming Ink

The film-forming ink 300 according to the embodiment includes a film-forming material and a liquid medium which dissolves or disperses the film-forming material.

This film-forming ink 300 is applied onto the substrate S (in this embodiment, the hole injection layer 4) and the liquid medium is removed to form a film (in this embodiment, the hole transport layer 5) including the film-forming material as the major component. As a result, a target film (in this embodiment, the hole transport layer 5) or a precursor film thereof can be formed.

In particular, such a film-forming ink 300 is used for forming a film with the above-described liquid droplet discharging device 200, that is, for forming a film with a liquid droplet discharge method. As a result, even in a small region, the film-forming ink 300 can be applied to a desired position and area. In addition, the liquid droplet discharge method has an advantage compared to a vapor deposition method, in that film-forming processes are simple and the amount of raw materials (film-forming materials) used can be reduced.

In addition, in the liquid droplet discharge method, when a π-conjugated compound is used as a film-forming material, π-conjugated compounds easily aggregate due to π-π stacking. Therefore, an effect obtained by applying the liquid droplet discharge method to the film-forming ink according to the embodiment, is remarkable.

Hereinafter, the film-forming ink 300 according to the embodiment will be described in detail.

Film-Forming Material

The film-forming material included in the film-forming ink 300 according to the embodiment is a constituent material of a target film (in this embodiment, the hole transport layer 5) or a precursor thereof.

In the film-forming ink 300, the film-forming material may be dissolved or dispersed in the liquid medium described below. When the film-forming material is dispersed in the liquid medium, the average particle size of the film-forming material is preferably 20 nm to 200 nm and more preferably 5 nm to 90 nm. As a result, the stability of the film-forming material dispersed in the film-forming ink 300 can be improved.

It is preferable that the film-forming material be soluble in a non-aqueous solvent. Such a film-forming material can be dissolved in the liquid medium. Therefore, even when a high molecular weight material is used as the film-forming material, a film can be uniformly formed.

In this embodiment, a film-forming material used in this process is a material configuring a hole transport layer of an organic electroluminescence element or a precursor thereof.

In addition, the above-described light emitting element 1 is provided with the hole injection layer 4 on the anode 3 and the hole transport layer 5 is provided on the hole injection layer 4. The hole transport layer 5 is formed by coating the film-forming ink, in which the constituent material of the hole transport layer 5 or the precursor thereof is dissolved or dispersed in a non-aqueous solvent or dispersion medium, on the hole injection layer 4 which is formed using an aqueous solvent or dispersion medium. Therefore, when the film-forming ink 300 according to the embodiment is used for forming the hole transport layer 5, effects of the embodiment are remarkable.

In the light emitting element 1, the hole transport layer 5 is not necessarily provided as described above. Therefore, in such a case, the light emitting layer (red-light emitting layer 6) is provided on the hole injection layer 4. In this case, the red-light emitting layer 6 is formed by coating the film-forming ink, in which the constituent material of the red-light emitting layer 6 or the precursor thereof is dissolved or dispersed in a non-aqueous solvent or dispersion medium, on the hole injection layer 4. Therefore, when the film-forming ink according to the embodiment is used for forming the red-light emitting layer 6, effects of the embodiment are remarkable.

The content of the film-forming material in the film-forming ink 300 is determined depending on the application of the film-forming ink 300 and is not particularly limited. For example, the content is preferably 0.01 wt % to 20 wt % and more preferably 0.05 wt % to 15 wt %. When the content of the film-forming material is in the above-described range, a discharge property (discharge stability) from the liquid droplet discharge head (ink jet head) for forming a film is particularly superior.

Liquid Medium

The liquid medium included in the film-forming ink 300 according to the embodiment is a solvent or a dispersion medium which dissolves or disperses the above-described film-forming material. Most of the liquid medium is removed during film-forming processes described below.

In particular, such a liquid medium has a surface tension of 35 dyn/cm or less and includes an ether compound represented by Formula (I).

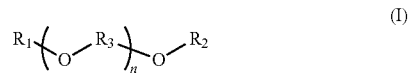

In Formula (I), $R_1$ and $R_2$ each independently represent a linear alkyl group, a branched alkyl group, or a cyclic alkyl group which has 1 to 4 carbon atoms. $R_3$ represents an alkylene group having 1 to 3 carbon atoms. In addition, n represents an integer of 0 to 4. In addition, when n is 2 or more, $R_3$'s may be the same as or different from each other.

According to the film-forming ink 300 configured as above, when the film-forming material contains π-conjugated compounds, an ether compound, which is not aromatic but aliphatic, is interposed between the π-conjugated compounds. Therefore, π-conjugated compounds can be prevented from aggregating due to π-π stacking.

As a result, even when the film-forming material contains π-conjugated compounds, the film-forming ink 300 according to the embodiment has superior preservation stability and a superior desolvation property (or a superior dispersion-medium-removal property).

In addition, the film-forming ink 300 according to the first aspect has a superior desolvation property or a superior dispersion-medium-removal property. Therefore, the liquid medium can be prevented or suppressed from remaining in the obtained film (in this embodiment, the hole transport layer 5). As a result, a film having superior film quality can be formed.

In particular, in the ether compound used in the film-forming ink 300 according to the embodiment, the number of ether oxygen atoms and the number of carbon atoms are optimized and heteroatoms other than ether oxygen atoms are not included (that is, a polar group (for example, ester, acetate, ketone, a hydroxyl group, a carboxyl group, or a sulfo group) other than an ether group is not included). Therefore, the ether compound can be used as a non-aqueous solvent or dispersion medium, and even when the ether compound remains in the obtained film, an adverse effect on the electrical characteristics of the film can be reduced. Furthermore, such a compound has less aggressiveness with respect to the film-forming material. From this point of view, a deterioration in the characteristics of the obtained film can be prevented.

In addition, when a non-aqueous solvent or dispersion medium is used, the film-forming ink can easily wet and be spread out on a layer (in this embodiment, the hole injection layer 4) which is formed using an aqueous solvent or dispersion.

In addition, in the film-forming ink according to the embodiment, it is not necessary that an additive such as a surfactant be used. Therefore, a deterioration in the characteristics of the obtained film due to an additive remaining in the film can be prevented.

In particular, in the ether compound used in the film-forming ink 300 according to the embodiment, the number of ether oxygen atoms and the number of carbon atoms are optimized and heteroatoms other than ether oxygen atoms are not included (that is, a polar group (for example, ester, acetate, ketone, a hydroxyl group, a carboxyl group, or a sulfo group) other than an ether group is not included). Therefore, the ether compound can be used as a non-aqueous solvent or dispersion medium, and even when the ether compound remains in the obtained film (in this embodiment, the hole transport layer 5), an adverse effect on the electrical characteristics of the film can be reduced. Furthermore, such a compound has less aggressiveness with respect to the film-forming material (in this embodiment, the hole transport material). From this point of view, a deterioration in the characteristics of the obtained film can be prevented.

On the other hand, for example, when the surface tension of the liquid medium included in the film-forming ink 300 is greater than 35 dyn/cm, the film-forming ink 300 cannot wet and cannot be spread out on the hole injection layer 4 uniformly.

In addition, in order to improve the wettability of the film-forming ink 300 on the hole injection layer 4, it is preferable that the surface tension of the liquid medium included in the film-forming ink 300 be less than or equal to 30 dyn/cm.

In addition, in Formula (I), for example, when n is 0 or 1, the molecular size of the ether compound is too small. Therefore, film-forming materials (π-conjugated compounds) cannot be prevented from aggregating due to π-π stacking. In addition, the boiling point of the liquid medium (ether compound) is too low. As a result, for example, when a liquid droplet discharge method is used, the clogging of nozzles of a liquid droplet discharge head occurs. On the other hand, in Formula (I), for example, when n is 5 or more, the viscosity of the liquid medium (ether compound) is too high. As a result, the film-forming ink cannot uniformly wet and cannot be spread out on a layer (film) which is formed using an aqueous solvent or dispersion medium or the boiling point of the liquid medium (ether compound) is too high. Accordingly, the desolvation property or dispersion-medium-removal property of the film-forming ink deteriorates.

Form this point of view, it is preferable that, in Formula (I), n represents 2 to 4. That is, it is preferable that the ether compound represented by Formula (I) have 3 to 5 ether bonds. As a result, the preservation stability of the film-forming ink 300 can be further improved. In addition, both of the wettability of the film-forming ink 300 on a layer (film) which is formed using an aqueous solvent or dispersion medium; and the desolvation property or dispersion-medium-removal property of the film-forming ink 300, can be improved. In addition, the excessive lowering of a boiling point of the liquid medium (ether compound) can be prevented. As a result, for example, when a liquid droplet discharge method is used, nozzles of a liquid droplet discharge head can be prevented from clogging.

In addition, in Formula (I), when n is 2 to 4, it is preferable that $R_3$ have 2 or 3 carbon atoms. As a result, when the film-forming material is soluble in a non-aqueous solvent, the film-forming material can be reliably dissolved in the liquid medium and an unintended material (for example, a member constituting a liquid droplet discharge head used for a liquid droplet discharge method) can be prevented or suppressed from being dissolved in the liquid medium.

On the other hand, in Formula (I), for example, when the number of carbon atoms in $R_3$ is too small, the solubility of a non-polar material in the liquid medium is too high and an unintended material may be dissolved in the liquid medium. In addition, in Formula (I), for example, when the number of carbon atoms in $R_3$ is too large, it is difficult to improve at the same time both of the wettability of the film-forming ink 300 on a layer (film) which is formed using an aqueous solvent or dispersion medium; and the desolvation property or dispersion-medium-removal property of the film-forming ink 300.

In addition, the content of the ether compound in the liquid medium is preferably 0.1 wt % to 100 wt %, more preferably 10 wt % to 100 wt %, and still more preferably 20 wt % to 100 wt %. As a result, the preservation stability of the film-forming ink 300 can be further improved. In addition, the wettability of the film-forming ink 300 on a layer (film) which is formed using an aqueous solvent or dispersion medium can also be improved.

In addition, the liquid medium may include a compound other than the compound represented by Formula (I). Examples of the compound which can be included in the liquid medium include naphthalene derivatives such as naphthalene and dimethylnaphthalene, benzene (boiling point 80.1° C., melting point 5.5° C.), toluene (boiling point 110.6° C., melting point −93° C.), o-xylene (p-, m-) (boiling point 144° C., melting point −25° C.), trimethylbenzene (boiling point 165° C., melting point −45° C.), tetralin (tetrahydronaphthalene, boiling point 208° C., melting point −35.8° C.), cyclohexylbenzene (boiling point 237.5° C., melting point 5° C.), 1,4-dichlorobenzene (boiling point 174° C., melting point 53.5° C.), 1,2,3-trichlorobenzene (boiling point 221° C., melting point 52.6° C.), tetrahydrofuran (boiling point 66° C., melting point −108.5° C.), diethyl ether (boiling point 35° C., melting point −116° C.), diisopropyl ether (boiling point 69° C., melting point −85.6° C.), ethylene glycol (boiling point 197.3° C., melting point −12.9° C.), ethylene glycol diethyl ether (boiling point 190° C., melting point −44.3° C.), dioxane (boiling point 101.1° C., melting point 11.8° C.), anisole (methoxybenzene, boiling point 154° C., melting point −37° C.), dichloromethane (boiling point 40° C., melting point −96.7° C.), trichloromethane (boiling point 61.2° C., melting point −64° C.), carbon tetrachloride (tetrachloromethane, boiling point 76.7° C., melting point −28.6° C.), pentane (boiling point 36° C., melting point −131° C.), hexane (boiling point 69° C., melting point −95° C.), cyclohexane (boiling point 81° C., melting point 7° C.), acetone (boiling point 56.5° C., melting point −94° C.), 1-methyl-2-pyrrolidinone (NMP, boiling point 204° C., melting point −24° C.) methylethylketone (boiling point 79.6° C., melting point −86° C.), alpha-tetralone (boiling point 257° C., melting point 7° C.), cyclohexanone (boiling point 157° C., melting point −45° C.), ethyl acetate (boiling point 77.1° C., melting point −83.6° C.), butyl acetate (boiling point 126° C., melting point −74° C.) methanol (boiling point 67° C., melting point −97° C.), ethanol (boiling point 78.4° C., melting point −114.3° C.), isopropyl alcohol (boiling point 82.4° C., melting point −89.5° C.), 1-propanol (boiling point 97.15° C., melting point −126.5° C.), acetonitrile (boiling point 82° C., melting point −45° C.), N,N-dimethylformamide (DMF, boiling point 153° C., melting point −61° C.), N,N-dimethylacetamide (DMAc: boiling point 165° C., melting point −20° C.), 1,3-dimethyl-2-imidazolidinone (boiling point 220° C., melting point 8° C.), dimethyl sulfoxide (boiling point 189° C., melting point 18.5° C.), 4-tert-butylanisole (boiling point 222° C., melting point 18° C.), trans-anethole (boiling point 235° C., melting point 20° C.), 1,2-dimethoxybenzene (boiling point 206.7° C., melting point 22.5° C.), 2-methoxybiphenyl (boiling point 274° C., melting point 28° C.), phenyl ether (boiling point 258.3° C., melting point 28° C.), 2-ethoxynaphthalene (boiling point 282° C., melting point 35° C.), benzyl phenyl ether (boiling point 288° C., melting point 39° C.), 2,6-dimethoxytoluene (boiling point 222° C., melting point 39° C.), 2-propoxynaphthalene (boiling point 305° C., melting point 40° C.), 1,2,3-trimethoxybenzene (boiling point 235° C., melting point 45° C.), and 1,4-dichlorobenzene (boiling point 174° C., melting point 53.5° C.) Among these, one kind or a combination of two or more kinds can be used.

In addition, as the compound other than the compound represented by Formula (I), an aromatic hydrocarbon compound is preferably used. That is, it is preferable that the liquid medium contains an aromatic hydrocarbon compound in addition to the ether compound. As a result, when the film-forming material is soluble in a non-aqueous solvent, the film-forming material can be reliably dissolved in the liquid medium; and furthermore, when the film-forming ink 300 is manufactured, a liquid medium having a desired surface tension can be easily prepared according to a mixing ratio of the ether compound and the aromatic hydrocarbon compound.

The viscosity (hereinafter, simply referred to as "the viscosity") of the liquid medium at normal temperature (20° C.) is preferably less than or equal to 4 cP and more preferably less than or equal to 2 cP. As a result, the wettability of the film-forming ink 300 on a layer (in this embodiment, the hole injection layer 4) which is formed using an aqueous solvent or dispersion medium can be effectively improved.

In addition, the boiling point of the liquid medium at normal pressure is preferably 80° C. to 350° C., more preferably 160° C. to 300° C., and still more preferably 200° C. to 280° C. As a result, the volatility of the liquid medium of the film-forming ink 300 is suppressed and the film-forming ink 300 can be stably discharged using the liquid droplet discharge method. In addition, the desolvation property or dispersion-medium-removal property of the film-forming ink can be improved.

The content of the liquid medium in the film-forming ink 300 is preferably 80 wt % to 99.99 wt % and more preferably 85 wt % to 99.95 wt %.

The above-described film-forming ink is used for forming a film using the ink jet method (liquid droplet discharge method) described below. According to the ink jet method, fine patterning can be performed relatively simply and reliably.

Such a film-forming ink is liquid in an ink application process [3-1] described below.

In addition, the viscosity of the film-forming ink is not particularly limited, and is preferably about 1 cP to 5 cP. By adjusting the viscosity of the film-forming ink to the above-described range, an effect obtained by lowering the viscosity of the above-described liquid medium.

The hole transport layer 5 is formed using the above-described liquid droplet discharging device 200 and the film-forming ink 300.

Film-Forming Method

Specifically, a method of forming the hole transport layer 5 (film-forming method) includes a process [3-1] of applying the film-forming ink on the substrate S (specifically, the hole injection layer 4); and a process [3-2] of removing the liquid medium from the film-forming ink to form the hole transport layer 5.

As a result, a film having superior film quality can be formed.

In addition, when a non-aqueous solvent or dispersion medium is used, the film-forming ink can easily wet and be spread out on a layer which is formed using an aqueous solvent or dispersion medium, without using an additive such as a surfactant. As a result, a film having superior film quality can be simply formed in a short period of time.

[3-1]

Specifically, using the above-described liquid droplet discharging device 200, a desired amount of the film-forming ink 300 is applied onto the hole injection layer 4.

The temperature and the pressure of an atmosphere in the process [3-1] are respectively determined according to the composition of the film-forming ink 300 and are not limited as long as the film-forming ink 300 can be applied onto the substrate S. However, normal temperature and normal pressure are preferable. As a result, the film-forming ink 300 can be simply applied.

[3-2]

The liquid medium is removed from the film-forming ink 300, which is formed on the substrate S (in this embodiment, on the laminate including the substrate 20, the anode 3, and the hole injection layer 4; specifically, on the hole injection layer 4), to form a film (that is, the hole transport layer 5 or the precursor film thereof) including the film-forming material as the major component.

The temperature and the pressure of an atmosphere in the process [3-2] are respectively determined according to the composition of the film-forming ink 300 and are not limited as long as the liquid medium can be removed from the film-forming ink 300 on the substrate S. However, it is preferable that the liquid medium be removed by heating under reduced pressure. As a result, the liquid medium can be effectively removed from the film-forming ink 300.

A heating method is not particularly limited, and heating can be performed by, for example, a hot plate or infrared rays. In addition, heating may be performed by a rubber heater which is provided on the table 140 of the above-described liquid droplet discharging device 200.

The heating temperature is not particularly limited, and is preferably about 60° C. to 100° C.

In addition, the heating time is not particularly limited, and is preferably about 1 minute to 60 minutes.

When the pressure is reduced as described above, the pressure is not particularly limited, and is preferably about $10^{-7}$ Pa to 10 Pa.

A film which is formed by removing the liquid medium as described above includes the constituent material of the hole transport layer 5, which is the target film, or the precursor.

When the precursor of the constituent material of the hole transport layer 5 is used as the film-forming material, a film obtained by removing the liquid medium is subjected to a predetermined treatment as necessary. For example, the film may be heated (calcined) in an inert gas atmosphere.

The heating temperature is not particularly limited, and is preferably about 100° C. to 200° C.

In addition, the heating time is not particularly limited, and is preferably about 10 minutes to 2 hours.

In this way, the hole transport layer 5 is formed.

[4] Next, the red-light emitting layer 6 is formed on the hole transport layer 5.

The red-light emitting layer 6 can be formed through a gas phase process using, for example, a CVD method or a dry plating method such as vacuum deposition or sputtering.

In addition, the red-light emitting layer 6 can also be formed by supplying a red-light-emitting-layer-forming material, obtained by dissolving or dispersing the constituent material of the red-light emitting layer 6 in a solvent or in a dispersion medium, onto the hole transport layer 5 and drying the resultant (removing the solvent or the dispersion medium).

The red-light emitting layer 6 can be formed using the film-forming ink and the film-forming method according to the embodiments in the same manner as the formation of the hole transport layer 5. At this time, when the film-forming material contains a metal complex, an ether oxygen atom is coordinated to a metal of the metal complex. Therefore, effects of dissolved oxygen and water in a solvent or dispersion medium on a bond between the metal of the metal complex and a ligand can be alleviated. Therefore, even when the film-forming material contains a metal complex, the film-forming ink to be used has superior preservation stability and thus a film having superior film quality can be formed.

In addition, when the hole transport layer 5 is not provided or when the hole transport layer 5 is formed using an aqueous solvent or dispersion medium-based film-forming ink, the red-light emitting layer 6 is formed using the film-forming ink and the film-forming method according to the embodiments in the same manner as the formation of the hole transport layer 5.

[5] Next, the first interlayer 7A is formed on the red-light emitting layer 6.

The first interlayer 7A can be formed through a gas phase process using, for example, a CVD method or a dry plating method such as vacuum deposition or sputtering.

In addition, the first interlayer 7A can also be formed by supplying a first-interlayer-forming material, obtained by dissolving or dispersing the constituent material of the first interlayer 7A in a solvent or in a dispersion medium, onto the red-light emitting layer 6 and drying the resultant (removing the solvent or the dispersion medium).

[6] Next, the blue-light emitting layer 8 is formed on the first interlayer 7A.

The blue-light emitting layer 8 can be formed through a gas phase process using, for example, a CVD method or a dry plating method such as vacuum deposition or sputtering.

[7] Next, the second interlayer 7B is formed on the blue-light emitting layer 8.

The second interlayer 7B is formed using the same method as the method of forming the first interlayer 7A, described in the process [5].

[8] Next, the green-light emitting layer 9 is formed on the second interlayer 7B.

The green-light emitting layer 9 can be formed through a gas phase process using, for example, a CVD method or a dry plating method such as vacuum deposition or sputtering.

[9] Next, the electron transport layer 10 is formed on the green-light emitting layer 9.

The electron transport layer 10 can be formed through a gas phase process using, for example, a CVD method or a dry plating method such as vacuum deposition or sputtering.

In addition, the electron transport layer 10 can also be formed by supplying an electron-transport-layer-forming material, obtained by dissolving or dispersing the electron transport material in a solvent or in a dispersion medium, onto the green-light emitting layer 9 and drying the resultant (removing the solvent or the dispersion medium).

[10] Next, the electron injection layer 11 is formed on the electron transport layer 10.

When an inorganic material is used as the constituent material of the electron injection layer 11, the electron injection layer 11 is formed through a gas phase process using a CVD method or a dry method such as vacuum deposition or sputtering or the application and calcinations of an inorganic fine particle ink.

[11] Next, the cathode 12 is formed on the electron injection layer 11.

The cathode 12 can be formed using, for example, a vacuum deposition method, a sputtering method, the junction of metal foils, or the application and calcinations of a metal fine particle ink.

Through the above-described processes, the light emitting element 1 can be obtained.

Finally, the sealing member 13 is formed so as to cover the obtained light emitting element 1.

Since the above-described method of manufacturing the light emitting element 1 includes the processes [3-1] and [3-2], the hole transport layer 5 having superior film quality can be formed. In particular, since a surfactant does not remain in the light emitting element 1, the characteristics of the light emitting element 1 are superior. In addition, the light emitting element 1 can be manufactured at low cost.

In addition, when the hole transport layer 5 is formed of the film-forming ink using a non-aqueous solvent or dispersion medium, the film-forming ink 300 can wet and be spread out on the hole injection layer 4 which is formed using an aqueous solvent or dispersion medium, without using an additive such as a surfactant. As a result, the hole transport layer 5 having superior film quality can be simply formed in a short period of time. In particular, since a surfactant does not remain in the light emitting element 1, the characteristics of the light emitting element 1 are superior. In addition, the light emitting element 1 can be manufactured at low cost.

The above-described light emitting element 1 can be used as, for example, a light source. In addition, by arranging the plural light emitting elements 1 in a matrix, a display device can be configured.

A method of driving a display device is not particularly limited, and either an active matrix type or a passive matrix type can be used.

Second Embodiment

A second embodiment is different from the first embodiment in that light emitting elements are formed by elements which emit red light, green light, and blue light, respectively.

Light Emitting Device

Figure 8:
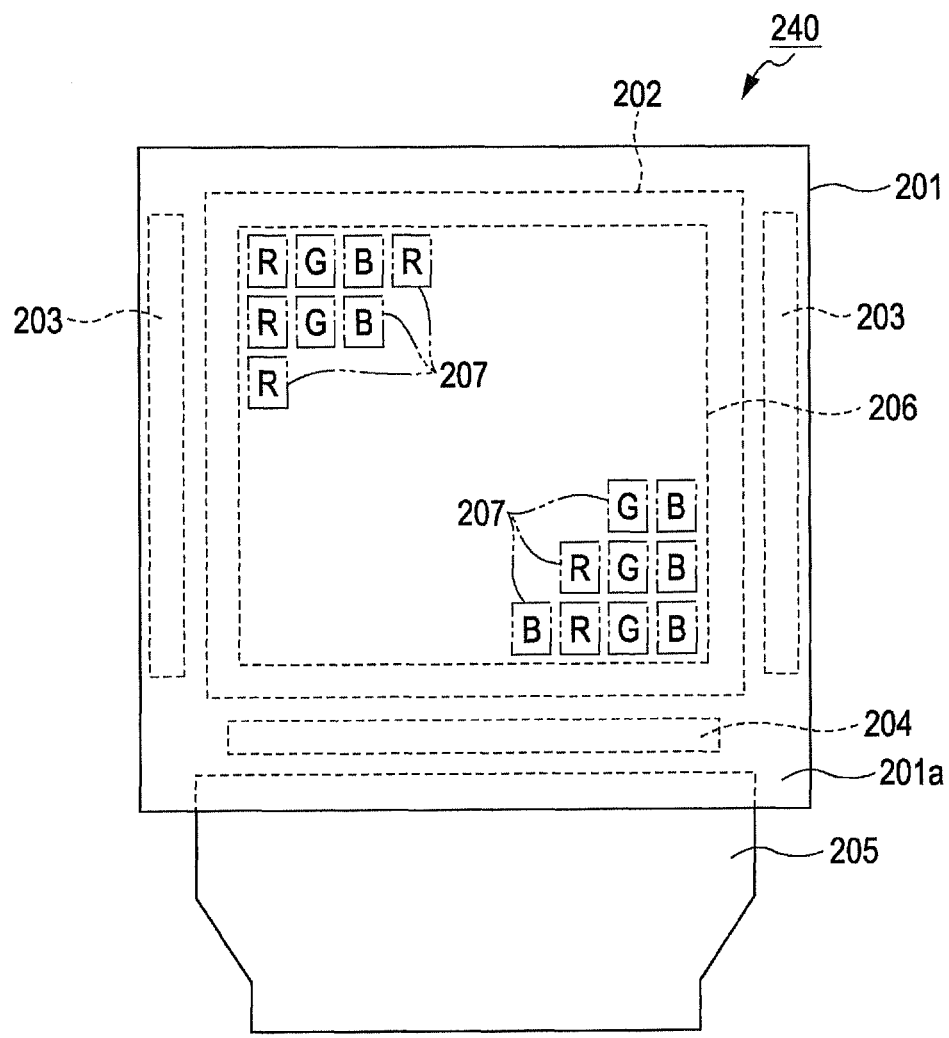
FIG. 8 is a plan view illustrating an example of a display device including a light emitting device according to an embodiment of the invention.
Figure 9:
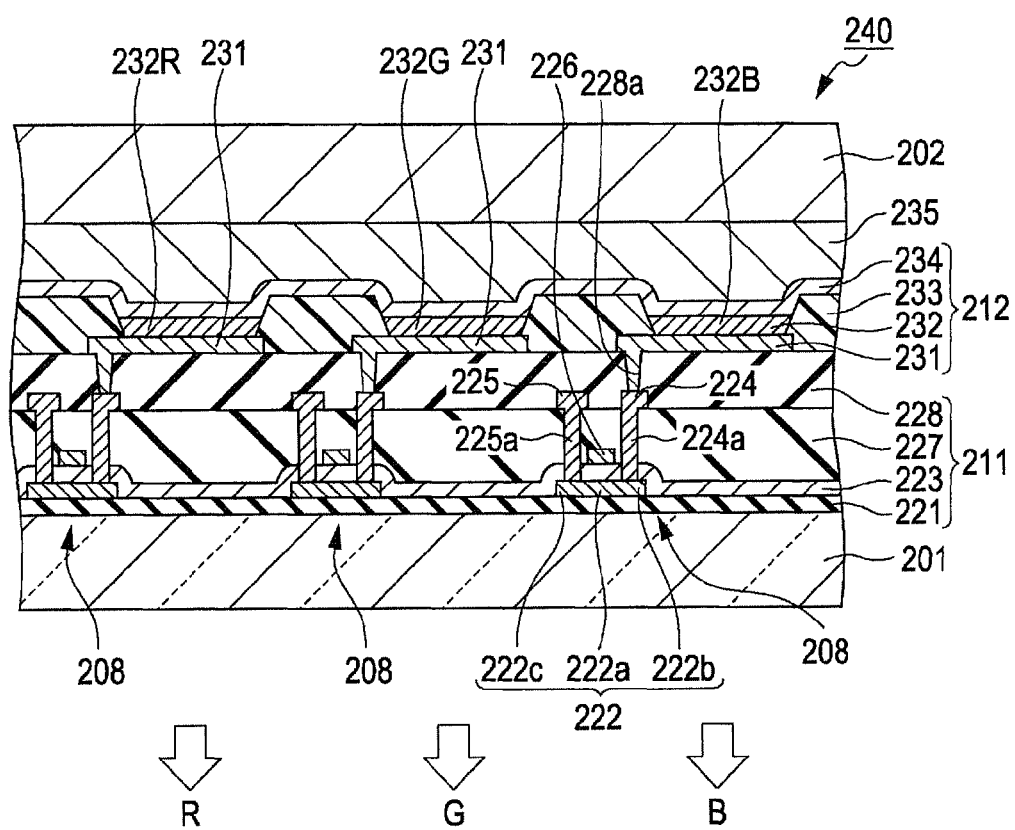
FIG. 9 is a cross-sectional view illustrating an example of a display device including a light emitting device according to an embodiment of the invention.

Next, a light emitting device including light emitting elements, which are manufactured according to the method of manufacturing a light emitting element according to the embodiment, will be described with reference to FIGS. 8 and 9. FIG. 8 is a front view schematically illustrating a configuration of the light emitting device according to the embodiment, and FIG. 9 is a cross-sectional view schematically illustrating structures of major components in the light emitting device according to the embodiment.

As illustrated in FIG. 8, an organic EL device 240 according to the embodiment includes an element substrate 201 which includes three colors (R (red), G (green), and B (Blue)) of light emitting pixels 207, and a sealing substrate 202 which is disposed facing the element substrate 201 at a predetermined interval. The sealing substrate 202 is bonded to the element substrate 201 with a sealing agent having high airtightness so as to seal a light emitting region 206 which is provided with the plural light emitting pixels 207.

The light emitting pixels 207 include an organic EL element 212 (refer to FIG. 6) as light emitting elements described below, and adopt a so-called stripe form in which light emitting pixels 207 which emit the same color of light are vertically arranged in the drawing. In practice, the light emitting pixels 207 are very small, but are enlarged in the drawing for convenience of illustration.

The element substrate 201 is slightly larger than the sealing substrate 202, and is provided with two scanning line drive circuits 203 and a data line drive circuit 204, which drive the light emitting pixels 207, in a portion thereof which protrudes in a frame shape. The scanning line drive circuits 203 and the data line drive circuit 204 may be mounted onto the element substrate 201 as, for example, ICs in which electric circuits are integrated. Alternatively, the scanning line drive circuits 203 and the data line drive circuit 204 may be formed directly on a surface of the element substrate 201.

On a terminal 201a of the element substrate 201, a relay substrate 205 for connecting the scanning line drive circuits 203 and the data line drive circuit 204 to an external drive circuit is mounted. As the relay substrate 205, for example, a flexible circuit board can be used.

As illustrated in FIG. 9, in the organic EL device 240, the organic EL element 212 includes anodes 231 as pixel electrodes, partition walls 233 which partition the anodes 231, and functional layers 232 which include light emitting layers having organic films formed on the anodes 231. In addition, the organic EL element 212 includes a cathode 234 as a common electrode which is formed facing the anodes 231 through the functional layers 232.

The partition walls 233 are formed so as to be liquid-repellent through plasma treatment using, for example, $CF_4$ as a treatment gas, or are formed using a photosensitive resist having repellency to a functional fluid described below. Examples of the photosensitive resist include a liquid-repellent resist composition obtained by adding a fluoropolymer to a photosensitive acrylic resin. The partition walls 233 cover parts of the vicinity of the anodes 231 configuring the light emitting pixels 207, and are provided so as to partition the plural anodes 231.

The anodes 231 are connected to one of three terminals of TFT elements 208 which are formed on the element substrate 201, and are formed from, for example, ITO (Indium Tin Oxide), which is a transparent electrode material, so as to have a thickness of about 100 nm.

The cathode 234 is formed from a metal material having light reflectivity such as Al or Ag, an alloy of the metal material and another metal (for example, Mg), or the like.

The organic EL device 240 according to the embodiment has a so-called bottom emission type structure in which a drive current is caused to flow between the anodes 231 and the cathode 234 and light emitted from the functional layers 232 is reflected from the cathode 234 to be extracted from the element substrate 201 side. Therefore, a transparent substrate such as glass is used as the element substrate 201. In addition, both a transparent substrate and an opaque substrate can be used as the sealing substrate 202. Examples of the opaque substrate include a ceramic such as alumina, a metal sheet formed from stainless steel which is subjected to insulating treatment such as surface oxidation, a thermosetting resin, and a thermoplastic resin.

The functional layer 232 is configured by plural thin film layers including a hole injection layer, a hole transport layer, a light emitting layer, an electron transport layer, and an electron injection layer which are formed from organic films. These layers are laminated in the mentioned order from the anode 231 side. In the embodiment, these thin film layers are formed using a liquid coating method or a vacuum deposition method. Examples of the liquid coating method include the above-described methods of the liquid droplet discharge method using the liquid droplet discharging device 200, spin coating method, and the like.

Method of Manufacturing Light Emitting Element

Figure 10:
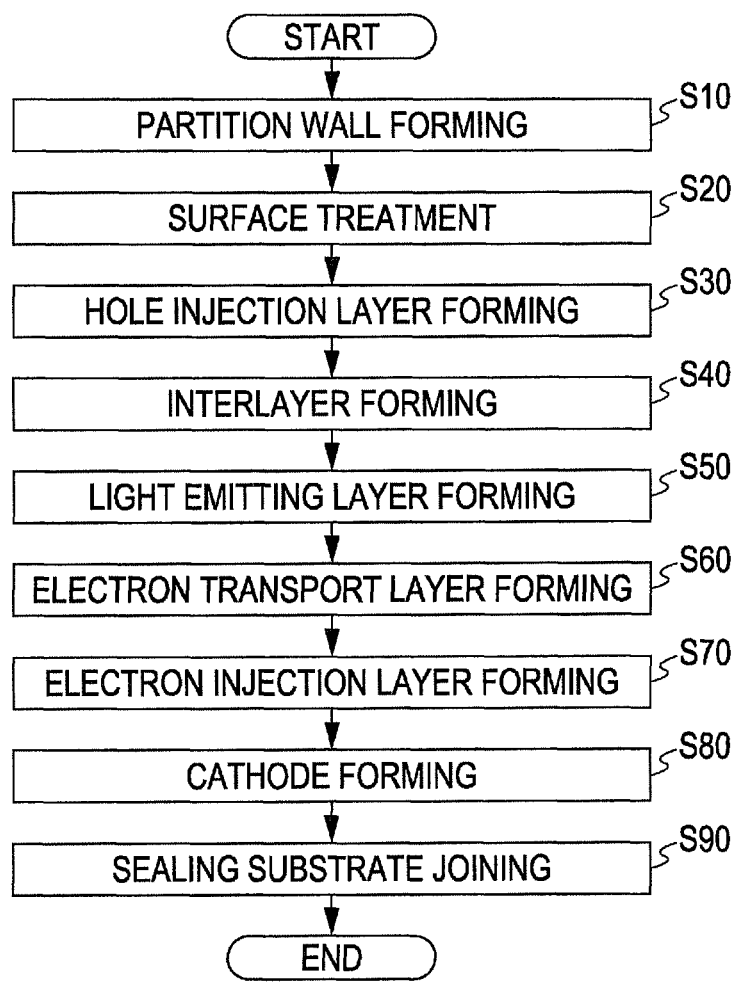
FIG. 10 is a flowchart illustrating an example of manufacturing a display device including a light emitting device according to an embodiment of the invention.

Next, a method of manufacturing the organic EL element 212 as the method of manufacturing a light emitting element according to the embodiment will be described with reference to FIGS. 10 to 13J. FIG. 10 is a flowchart illustrating the method of manufacturing the organic EL element according to the embodiment, and FIGS. 11A to 11D, FIGS. 12E to 12G, and FIGS. 13H to 13J are cross-sectional diagrams schematically illustrating the method of manufacturing the organic EL element according to the embodiment.

As illustrated in FIG. 10, the method of manufacturing the organic EL element 212 according to the embodiment at least includes a partition wall forming step (step S10), a surface treatment step (step S20) of treating a surface of a substrate on which the partition walls are formed, a hole injection layer forming step (step S30), a hole transport layer forming step (step S40), a light emitting layer forming step (step S50), an electron transport layer forming step (step S60), an electron injection layer forming step (step S70), a cathode forming step (step S80), and a sealing substrate joining step (step S90) of joining the element substrate 201 on which organic EL element is formed to the sealing substrate 202. In the step of forming the anodes 231 on the element substrate 201, a well-known method may be used, and the detailed description thereof will be omitted in the embodiment.

Figure 11A:
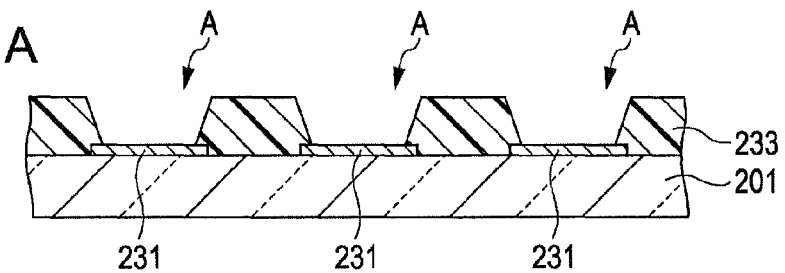
FIG. 11A to 11D are cross-sectional views illustrating an example of manufacturing a display device including a light emitting device according to an embodiment of the invention.

Step S10 of FIG. 10 is the partition wall forming step. In step S10, as illustrated in FIG. 11A, the partition walls 233 which cover parts of the vicinity of the anodes 231 and partitions the anodes 231 are formed. The partition walls are formed with a method of, for example, coating a surface of the element substrate 201, on which the anodes 231 are formed, with a photosensitive phenol resin or a polyimide resin so as to have a thickness of about 1 µm to 3 µm. Examples of the coating method include a transfer method and a slit coating method. Light is exposed for development using masks corresponding to the shapes of the light emitting pixels. As a result, the partition walls 233 corresponding to the light emitting pixels can be formed. In this case, the shapes of the light emitting pixels are rectangular and the light emitting pixels are arranged in a planar matrix. Therefore, the partition walls 233 are formed in planar lattices and have a function of partitioning the light emitting pixels. Hereinafter, regions of the light emitting pixels which are partitioned by the partition walls 233 will be referred to as film-forming regions A. Then, the process proceeds to step S20.

Step S20 of FIG. 10 is the surface treatment step. In step S20, a surface of the element substrate 201, on which the partition walls 233 are formed, is subjected to hydrophilic treatment and liquid-repellent treatment. First, plasma treatment is performed using oxygen as a treatment gas such that the surfaces of the anodes 231, mainly formed from inorganic materials, are hydrophilic. Next, plasma treatment is performed using a fluorine-based gas, such as $CF_4$, as a treatment gas and fluorine is introduced into the surfaces of the partition walls 233 formed form an organic material such that the surfaces are liquid-repellent. Then, the process proceeds to step S30.

Figure 11B:
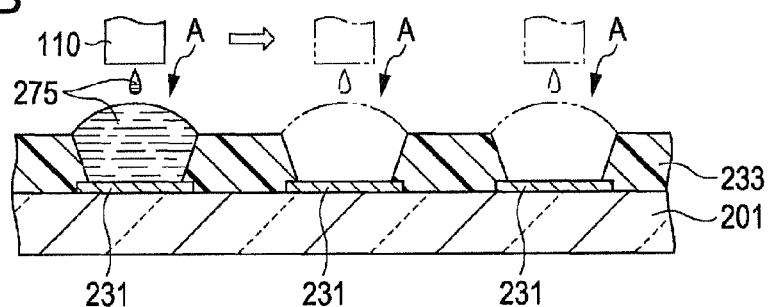

Step S30 of FIG. 10 is the hole injection layer forming step. In step S30, as illustrated in FIG. 11B, the film-forming regions A are coated with a liquid material 275 containing a hole-injection-layer-forming material. The liquid material 275 is an example of a functional layer-forming ink according to the embodiment and is the film-forming ink which is described in the first embodiment.

In a method of coating the film-forming regions A with the liquid material 275, the above-described liquid droplet discharging device 200 which can discharge the liquid material (ink) from the nozzles 118 of the head 110 is used. The head 110 and the element substrate 201 are arranged facing each other and the liquid material 275 is discharged from the head 110. Droplets of the discharged liquid material 275 are applied onto the anodes 231, which are subjected to hydrophilic treatment, and wet and are spread out on the anodes 231. In addition, a necessary amount of the droplets corresponding to the area of the film-forming regions A is discharged such that the thickness of a dried hole injection layer is about 50 nm to 70 nm. Then, the process proceeds to a drying step.

Figure 11C:
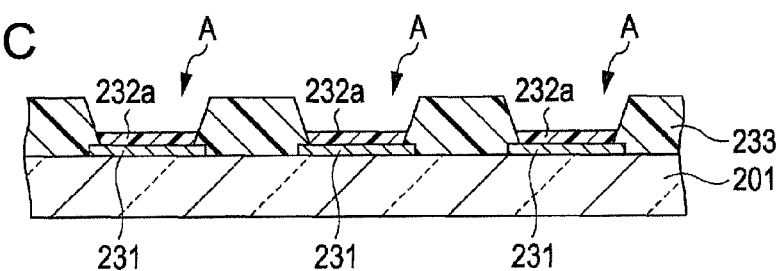

In the drying step, the element substrate 201 is heated and dried with a method such as drying under reduced pressure or lamp annealing. As a result, a solvent component of the liquid material 275 is dried and removed and, as illustrated in FIG. 11C, hole injection layers 232a are formed on the anodes 231 in the film-forming regions A. In the embodiment, the hole injection layers 232a are formed from the same material in the respective film-forming regions A. However, the hole injection layers 232a may be formed from different materials depending on the color of emitted light so as to correspond to light emitting layers which will be formed later. Then, the process proceeds to step S40.

Figure 11D:
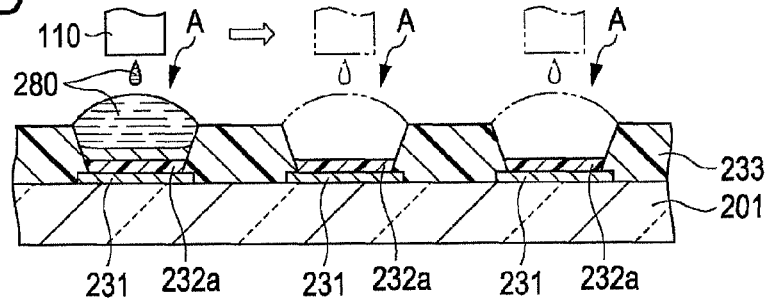

Step S40 of FIG. 10 is the hole transport layer forming step. In step S40, as illustrated in FIG. 11D, a liquid material 280 containing a hole-transport-layer-forming material is applied onto the film-forming regions A.

In a case where light emitting layers will be formed on hole transport layers with a liquid coating method, the liquid material 280 contains the film-forming ink which is described in the first embodiment as the hole-transport-layer-forming material.

In a method of coating the film-forming regions A with the liquid material 80, the liquid droplet discharging device 200 is used as in the case of coating the liquid material 275. In addition, a necessary amount of the droplets thereof corresponding to the area of the film-forming regions A is discharged such that the thickness of a dried hole transport layer is about 10 nm to 30 nm. Then, the process proceeds to a drying step.

Figure 12E:
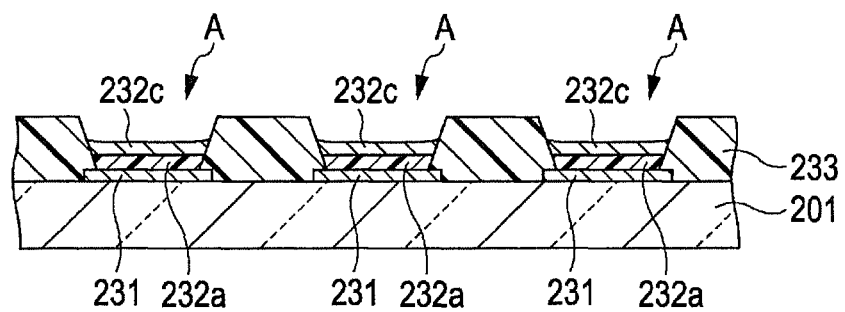
FIG. 12E to 12G are cross-sectional views illustrating an example of manufacturing a display device including a light emitting device according to an embodiment of the invention.

In the drying step, the element substrate 201 is heated and dried with a method such as drying under reduced pressure or lamp annealing. As a result, a solvent component of the liquid material 280 is dried and removed and, as illustrated in FIG. 12E, hole transport layers 232c are formed on the hole injection layers 232a in the film-forming regions A. Then, the process proceeds to step S50.

Figure 12F:
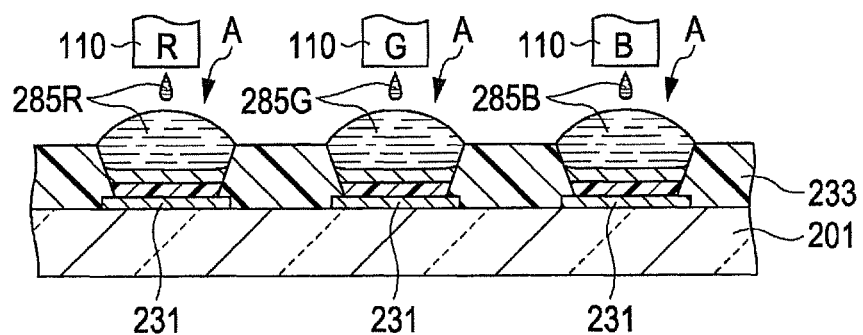

Step S50 of FIG. 10 is the light emitting layer forming step. In step S50, as illustrated in FIG. 12F, the film-forming regions A are respectively coated with the corresponding liquid materials 285R, 285G, and 285B which contain light-emitting-layer-forming materials.

The liquid materials 285R, 285G, and 285B are examples of a functional layer-forming ink according to the embodiment and are the film-forming ink which is described in the first embodiment.

In a method of coating the film-forming regions A with the liquid materials 285R, 285G, and 285B, the liquid droplet discharging device 200 is also used. Different heads 110 are filled with the liquid materials 285R, 285G, and 285B to discharge the materials.

The light emitting layers are formed with a liquid droplet discharging method which can evenly and stably discharge necessary amounts of the liquid materials 285R, 285G, and 285B to the film-forming regions A. Necessary amounts of the droplets thereof corresponding to the area of the film-forming regions A are discharged such that the thicknesses of dried light emitting layers are about 50 nm to 100 nm. Then, the process proceeds to a drying step.

Figure 12G:
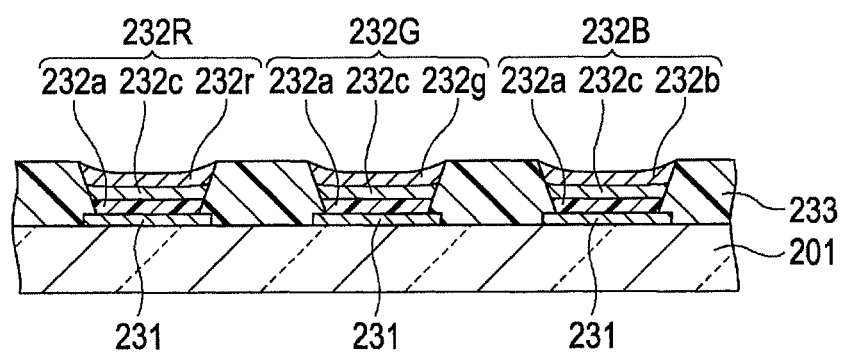

In the drying step, the discharged liquid materials 285R, 285G, and 285B according to the embodiment are heated and dried with a method such as drying under reduced pressure or lamp annealing. By using the liquid droplet discharging method, the film-forming regions A are evenly coated with necessary amounts of the liquid materials 285R, 285G, and 285B. Therefore, as illustrated in FIG. 12G, light emitting layers 232r, 232g, and 232b, which are formed after drying, have substantially the same thickness for each of the film-forming regions A. Then, the process proceeds to step S60.

Figure 13H:
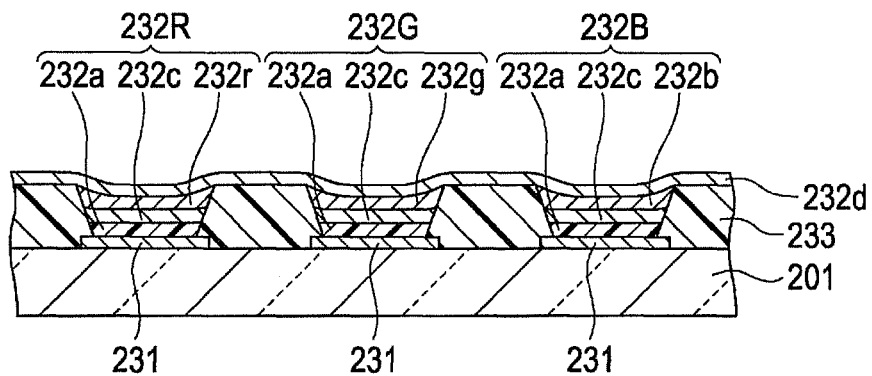
FIG. 13H to 13J are cross-sectional views illustrating an example of manufacturing a display device including a light emitting device according to an embodiment of the invention.

Step S60 of FIG. 10 is the electron-transport-layer-forming process. An electron transport layer 232d is formed using a vapor deposition method as in the first embodiment. As illustrated in FIG. 13H, the electron transport layer 232d is formed so as to cover the entire surface of the element substrate 201 including the surfaces of the respective light emitting layers 232r, 232g, and 232b. Then, the process proceeds to step S70.

Figure 13I:
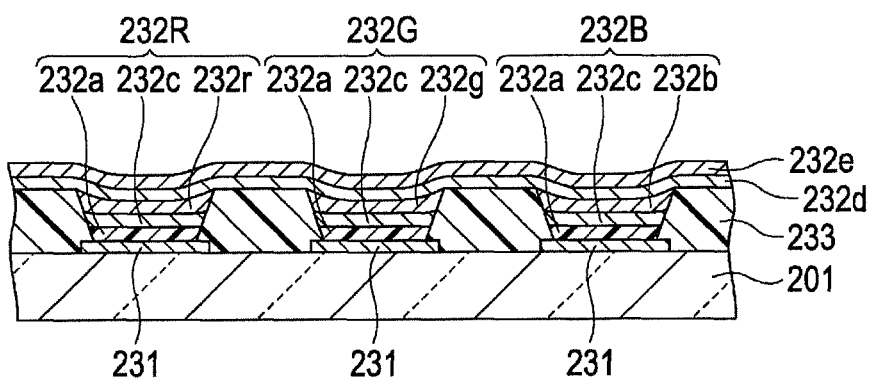

Step S70 of FIG. 10 is the electron injection layer forming step. An electron injection layer 232e is also formed using a vapor deposition method as in the first embodiment. As illustrated in FIG. 13I, the electron injection layer 232e is formed so as to cover the entire surface of the element substrate 201 including the surfaces of the respective light emitting layers 232r, 232g, and 232b. Then, the process proceeds to step S80.

Figure 13J:
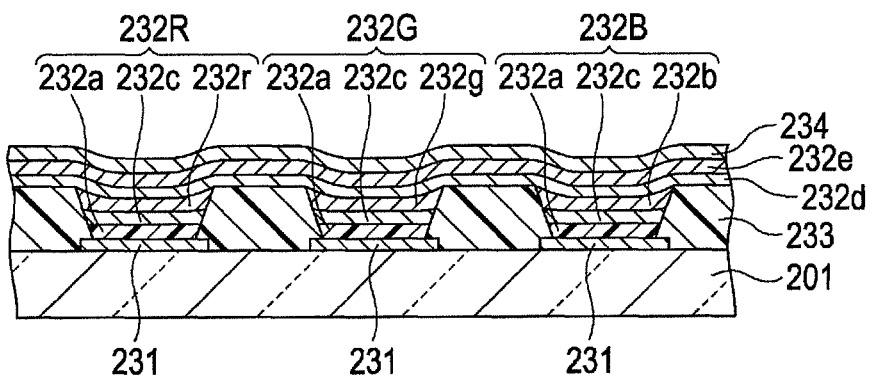

Step S80 of FIG. 10 is the cathode forming step. In step S80, as illustrated in FIG. 13J, a cathode 234 is formed so as to cover the partition walls 233 and the respective functional layers 232R, 232G, and 232B. As a result, the organic EL element 212 is formed.

It is preferable that the cathode 234 be formed from a combination of the above-described materials. It is preferable that an electron transport layer or an electron injection layer be optionally introduced between the functional layers 232R, 232G, and 232B and the cathode 234. Examples of a method of forming the cathode 234 include a vacuum deposition method, a sputtering method, and a CVD method. In particular, the vacuum deposition method is preferable from the viewpoint of preventing the functional layers 232R, 232G, and 232B from being damaged by heat. Then, the process proceeds to step S90.

Step S90 of FIG. 10 is the sealing substrate joining step. In step S90, a transparent sealing layer 235 is provided on the element substrate 201, on which the organic EL element 212 is formed, to seal the element substrate 201 and the transparent sealing substrate 202 without a gap therebetween. Furthermore, it is preferable that an adhesion layer, which prevents moisture, oxygen, and the like from entering the outer peripheral region of the sealing substrate 202, be provided for adhesion.

Display Device

Next, an example of a display device including a light emitting device according to an embodiment of the invention will be described.

Figure 4:
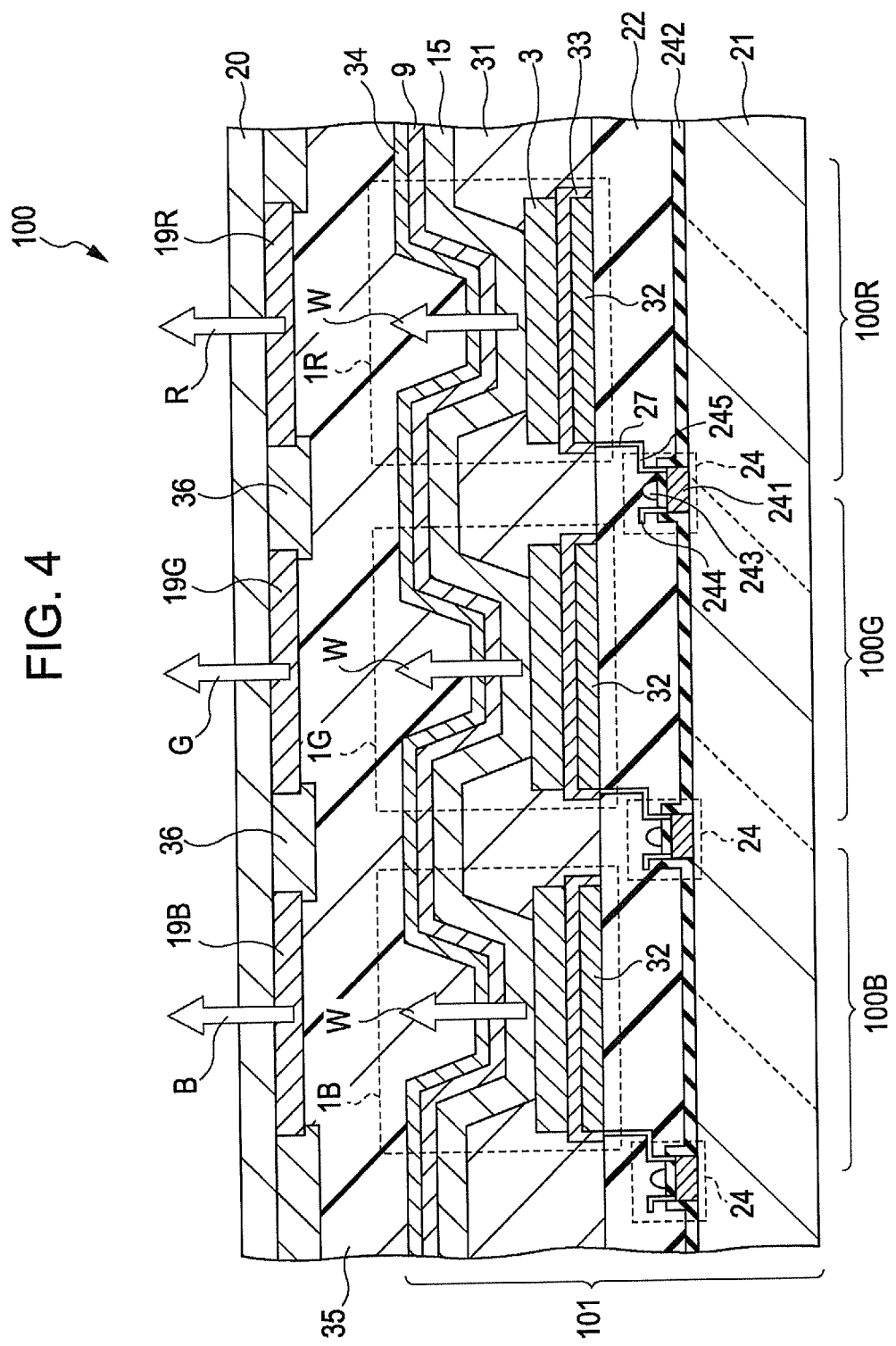
FIG. 4 is a cross-sectional view illustrating an example of a display device including a light emitting device according to an embodiment of the invention.

FIG. 4 is a cross-sectional view illustrating an example of a display device including a light emitting device according to an embodiment of the invention.

A display device 100 illustrated in FIG. 4 includes a substrate 21; plural light emitting elements 1R, 1G, and 1B and color filters 19R, 19G, and 19B which are provided to correspond to sub-pixels 100R, 100G, and 100B; and plural drive transistors 24 for driving the respective light emitting elements 1R, 1G, and 1B. The display device 100 described herein is a display panel having a top emission structure.

The plural drive transistors 24 are provided on the substrate 21, and a planarizing layer 22 including an insulating material is formed so as to cover these drive transistors 24.

Each of the drive transistors 24 includes a semiconductor layer 241 which is made of silicon, a gate insulating layer 242 which is formed on the semiconductor layer 241, and a gate electrode 243, a source electrode 244, and a drain electrode 245 which are formed on the gate insulating layer 242.

The light emitting elements 1R, 1G, and 1B are provided on the planarizing layer so as to correspond to the respective drive transistors 24.

In the light emitting element 1R, a reflective film 32, a corrosion protection film 33, the anode 3, the laminate (organic EL light emitting portion) 15, the cathode 12, and a cathode cover 34 are laminated on the planarizing layer 22 in this order. In this embodiment, the anode 3 of each of the light emitting elements 1R, 1G, and 1B configures an image electrode and is electrically connected to the drain electrode 245 of each of the drive transistors 24 through a conductive portion (wiring) 27. In addition, the cathode 12 of the respective light emitting elements 1R, 1G, and 1B is a common electrode.

The configurations of the light emitting elements 1G and 1B are the same as that of the light emitting element 1R. In addition, in FIG. 4, the same components as those of FIG. 1 are represented by the same reference numerals. In addition, the configuration (characteristics) of the reflective film 32 may vary depending on the light emitting elements 1R, 1G, and 1B according to the wavelength of light.

A wall surface 31 is provided between an adjacent two of the light emitting elements 1R, 1G, and 1B. In addition, an epoxy layer 35 formed of epoxy resin is formed so as to cover the light emitting elements 1R, 1G, and 1B.

Such a light emitting device 101 includes the light emitting elements 1R, 1G, and 1B having the same configurations as that of the above-described light emitting element 1 and thus can be manufactured at low cost with superior light emitting characteristics.

The color filters 19R, 19G, and 19B are provided on the epoxy layer 35 to correspond to the light emitting elements 1R, 1G, and 1B.

The color filter 19R converts white light W, emitted from the light emitting element 1R, into red light. The color filter 19G converts white light W, emitted from the light emitting element 1G, into green light. The color filter 19B converts white light W, emitted from the light emitting element 1B, into blue light. By using the light emitting elements 1R, 1G, and 1B in combination with such color filters 19R, 19G, and 19B, a full-color image can be displayed.

A light shielding layer 36 is formed between an adjacent two of the color filters 19R, 19G, and 19B. As a result, unintended light emitted from the sub-pixels 100R, 100G, and 100B can be prevented.

The substrate 20 is provided on the color filters 19R, 19G, and 19B and the light shielding layer 36 so as to cover them.

The above-described display device 100 may perform monochrome display and can perform color display by selecting light emitting materials used for the respective light emitting elements 1R, 1G, and 1B.

Such a display device 100 can be incorporated into various electronic apparatus.

Figure 5:
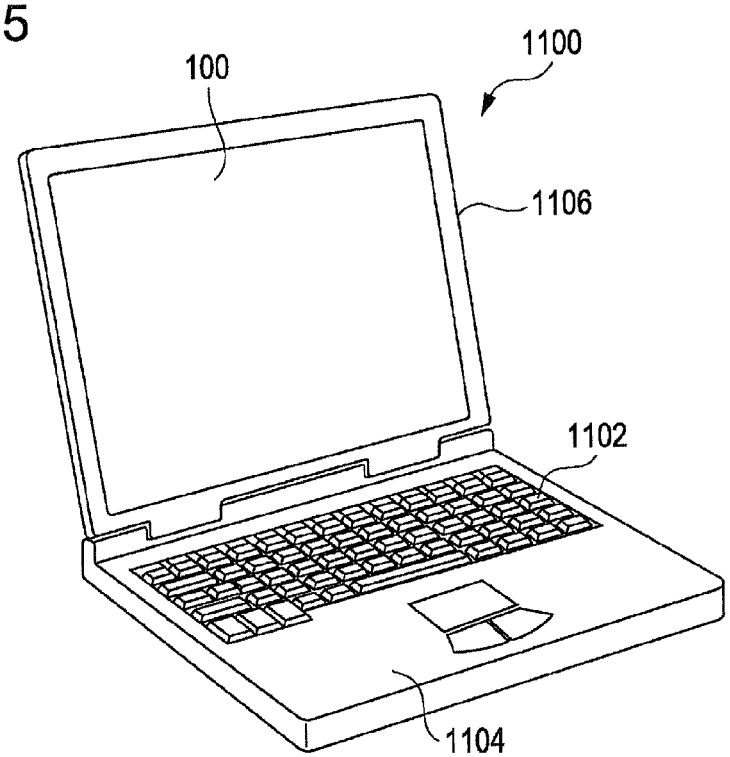
FIG. 5 is a perspective view illustrating a configuration of a mobile (or laptop) personal computer to which an electronic apparatus according to an embodiment of the invention is applied.

FIG. 5 is a perspective view illustrating a configuration of a mobile (or laptop) personal computer to which an electronic apparatus according to an embodiment of the invention is applied.

In this drawing, a personal computer 1100 includes a main body 1104 having a keyboard 1102 and a display unit 1106 having a display portion. The display unit 1106 is rotatably supported by the main body 1104 through a hinge structure.

In this personal computer 1100, the display portion included in the display unit 1106 is configured by the above-described display device 100.

Figure 6:
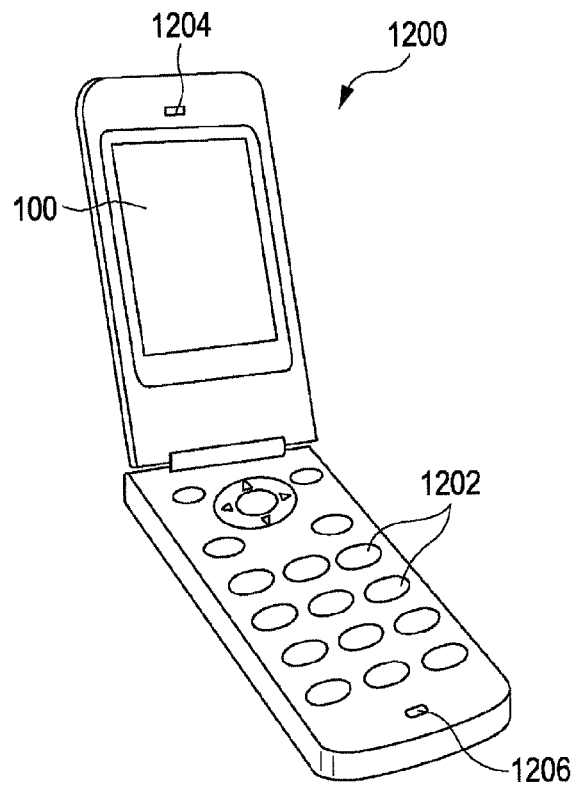
FIG. 6 is a perspective view illustrating a configuration of a mobile phone (including a PHS) to which an electronic apparatus according to an embodiment of the invention is applied.

FIG. 6 is a perspective view illustrating a configuration of a mobile phone (including a PHS) to which an electronic apparatus according to an embodiment of the invention is applied.

In the drawing, a mobile phone 1200 includes plural operation buttons 1202, an ear piece 1204, and a mouthpiece 1206, as well as a display portion.

In the mobile phone 1200, this display portion is configured by the above-described display device 100.

Figure 7:
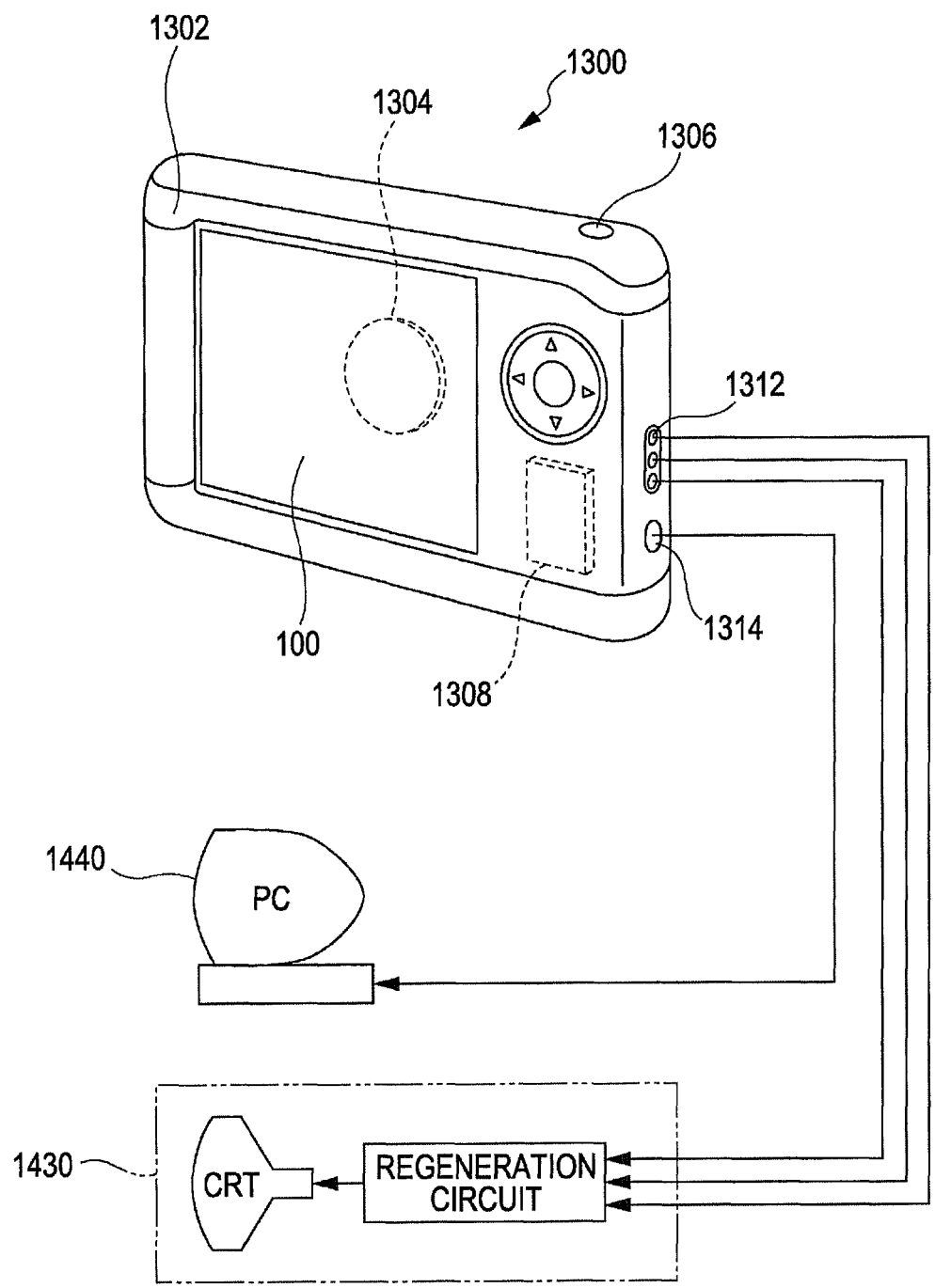
FIG. 7 is a perspective view illustrating a configuration of a digital still camera to which an electronic apparatus according to an embodiment of the invention is applied.

FIG. 7 is a perspective view illustrating a configuration of a digital still camera to which an electronic apparatus according to an embodiment of the invention is applied. In this drawing, the connection with an external device is simply shown.

In normal cameras, a silver-halide photographic film is exposed to light according to an optical image of an object. On the other hand, in a digital still camera 1300, an optical image of an object is converted into imaging signals (image signals) by an imaging device such as a Charge Coupled Device (CCD).

A display portion is provided on the rear surface of a case (body) 1302 in the digital still camera 1300, performs display based on imaging signals obtained by the CCD, and functions as a finder which displays an object as an electronic image.

In the digital still camera 1300, this display portion is configured by the above-described display device 100.

A circuit board 1308 is installed inside the case. This circuit board 1308 is provided with a memory in which imaging signals can be stored.

In addition, on the front side of the case 1302 (in this drawing, on the rear side), a light receiving unit 1304 including an optical lens (optical imaging system), and the CCD is provided.

When the photographer recognizes an object displayed on the display portion and presses a shutter release button 1306, imaging signals obtained by the CCD are transmitted and stored in the memory of the circuit board 1308 immediately.

In addition, the digital still camera 1300 is provided with a video signal output terminal 1312 and an input-output terminal 1314 for data transmission, on a side surface of the case 1302. As illustrated in the drawing, as necessary, a television monitor 1430 is connected to the video signal output terminal 1312 and a personal computer 1440 is connected to the input-output terminal 1314 for data transmission. Furthermore, with a predetermined operation, the imaging signals stored in the memory in the circuit board 1308 are output to the television monitor 1430 or the personal computer 1440.

The above-described electronic apparatus includes the above-described display device 100 (light emitting device 101) and thus has high reliability.

In addition to the personal computer (mobile personal computer) of FIG. 5, the mobile phone of FIG. 6, and the digital still camera of FIG. 7, the electronic apparatus according to the embodiment can be applied to, for example, a television, a video camera, a viewfinder type or monitor-direct-view type videotape recorder, a laptop personal computer, a car navigation device, a pager, an electronic organizer (including one equipped with a communication function), an electronic dictionary, a calculator, an electronic game device, a word processor, a work station, a television phone, a surveillance television monitor, electronic binoculars, a POS terminal, a device equipped with a touch panel (for example, a cash dispenser of a financial institution or a vending machine), a medical device (for example, an electronic thermometer, sphygmomanometer, blood glucose monitor, electrocardiogram device, ultrasonic diagnostic device, or endoscope display device), a fishfinder, various measurement devices, an indicator (for example, an indicator of a vehicle, a plane, or a ship), a flight simulator, other kinds of monitors, and a projection type display device such as a projector.

Hereinabove, the film-forming ink, the film-forming method, the method of manufacturing a light emitting element, the light emitting element, the light emitting device, and the electronic apparatus according to the embodiments have been described with reference to the drawings, but the invention is not limited thereto.

For example, in the above-described embodiments, the light emitting element includes three light emitting layers. However, the light emitting element may include one, two, or four or more light emitting layers. For example, in the above-described embodiments, one or two light emitting layers of the light emitting element are not necessarily provided, or another one or more layers may be provided thereto. In addition, the colors of light emitted from the light emitting layer are not limited to the above-described R, G, and B according to the above-described embodiments.

In addition, the light emitting material, which is used for the light emitting layer provided in contact with the hole injection layer or the hole transport layer, is not limited to the red-light emitting material, and may be, for example, a blue-light emitting material, a green-light emitting material, or a yellow-light emitting material.

In addition, in the above-described embodiments, an example in which the light emitting device is incorporated into the display device has been described. However, the light emitting device according to the embodiment is not limited thereto and can be used as a light source of an exposure device of, for example, an electrochromic glass, an electronic paper, an illuminating device, or an electrophotographic printer.

In addition, in the above-described embodiments, an example in which the film-forming ink and the film-forming method according to the embodiments are applied to the manufacture of an organic EL element has been described. However, the film-forming ink and the film-forming method according to the embodiments are not limited thereto. However, when the film-forming ink and the film-forming method according to the embodiments are applied to the case where the film-forming material contains π-conjugated compounds, the effects thereof are remarkable, which is preferable.

EXAMPLE 1

Next, specific examples of the embodiments will be described.

1. Preparation of Liquid Medium

The following Samples No. 1-1 to No. 1-41 of the liquid medium (solvent) were prepared.

Sample No. 1-1
A mixed solvent obtained by adding 10 parts by mass of diethyl ether (bp: 34.6° C.), which is the compound ($n=0$, the number of carbon atoms in $R_1=2$, the number of carbon atoms in $R_2=2$) represented by Formula (I), to 90 parts by mass of 1,4-dimethylnaphthalene (bp: 268° C.)

Sample No. 1-2
A mixed solvent obtained by adding 10 parts by mass of ethyl propyl ether (bp: 62° C.), which is the compound ($n=0$, the number of carbon atoms in $R_1=2$, the number of carbon atoms in $R_2=3$) represented by Formula (I), to 90 parts by mass of 1,4-dimethylnaphthalene (bp: 268° C.)

Sample No. 1-3
A mixed solvent obtained by adding 10 parts by mass of diisopropyl ether (bp: 69° C.), which is the compound ($n=0$, the number of carbon atoms in $R_1=3$ (branched), the number of carbon atoms in $R_2=3$ (branched)) represented by Formula (I), to 90 parts by mass of 1,4-dimethylnaphthalene (bp: 268° C.)

Sample No. 1-4
A mixed solvent obtained by adding 10 parts by mass of dipropyl ether (bp: 34.6° C.), which is the compound ($n=0$, the number of carbon atoms in $R_1=3$, the number of carbon atoms in $R_2=3$) represented by Formula (I), to 90 parts by mass of 1,4-dimethylnaphthalene (bp: 268° C.)

Sample No. 1-5
A single solvent of cyclopentyl methyl ether (bp: 106° C.), which is the compound ($n=0$, the number of carbon atoms in $R_1=5$, the number of carbon atoms in $R_2=1$) represented by Formula (I)

Sample No. 1-6
A mixed solvent obtained by adding 10 parts by mass of sample No. 5 of the liquid medium to 90 parts by mass of 1,4-dimethylnaphthalene (bp: 268° C.)

Sample No. 1-7
A single solvent of dibutyl ether (bp: 141° C.), which is the compound ($n=0$, the number of carbon atoms in $R_1=4$, the number of carbon atoms in $R_2=4$) represented by Formula (I)

Sample No. 1-8
A mixed solvent obtained by adding 10 parts by mass of sample No. 7 of the liquid medium to 90 parts by mass of 1,4-dimethylnaphthalene (bp: 268° C.)

Sample No. 1-9
A single solvent of dioctyl ether (bp: 287° C.), which is the compound ($n=0$, the number of carbon atoms in $R_1=8$, the number of carbon atoms in $R_2=8$) represented by Formula (I)

Sample No. 1-10
A mixed solvent obtained by adding 10 parts by mass of the Sample no. 9 of the liquid medium to 90 parts by mass of 1,4-dimethylnaphthalene (bp: 268° C.)

Sample No. 1-11
A single solvent of ethylene glycol dimethyl ether (bp: 85° C.), which is the compound ($n=1$, the number of carbon atoms in $R_1=1$, the number of carbon atoms in $R_2=1$, the number of carbon atoms in $R_3=2$) represented by Formula (I)

Sample No. 1-12
A mixed solvent obtained by adding 10 parts by mass of the Sample no. 11 of the liquid medium to 90 parts by mass of 1,4-dimethylnaphthalene (bp: 268° C.)

Sample No. 1-13
A single solvent of ethylene glycol diethyl ether (bp: 121° C.), which is the compound ($n=1$, the number of carbon atoms in $R_1=2$, the number of carbon atoms in $R_2=2$) represented by Formula (I)

Sample No. 1-14
A mixed solvent obtained by adding 10 parts by mass of the Sample no. 13 of the liquid medium to 90 parts by mass of 1,4-dimethylnaphthalene (bp: 268° C.)

Sample No. 1-15
A single solvent of ethylene glycol dibutyl ether (bp: 203° C.), which is the compound ($n=1$, the number of carbon atoms in $R_1=4$, the number of carbon atoms in $R_2=4$) represented by Formula (I)

Sample No. 1-16
A mixed solvent obtained by adding 10 parts by mass of the Sample no. 15 of the liquid medium to 90 parts by mass of 1,4-dimethylnaphthalene (bp: 268° C.)

Sample No. 1-17
A single solvent of diethylene glycol dimethyl ether (bp: 162° C.), which is the compound ($n=2$, the number of carbon atoms in $R_1=1$, the number of carbon atoms in $R_2=1$, the number of carbon atoms in $R_3=2$) represented by Formula (I)

Sample No. 1-18
A mixed solvent obtained by adding 10 parts by mass of the Sample no. 17 of the liquid medium to 90 parts by mass of 1,4-dimethylnaphthalene (bp: 268° C.)

Sample No. 1-19
A single solvent of diethylene glycol ethyl methyl ether (bp: 176° C.), which is the compound ($n=2$, the number of carbon atoms in $R_1=2$, the number of carbon atoms in $R_2=1$, the number of carbon atoms in $R_3=2$) represented by Formula (I)

Sample No. 1-20
A mixed solvent obtained by adding 10 parts by mass of the Sample no. 19 of the liquid medium to 90 parts by mass of 1,4-dimethylnaphthalene (bp: 268° C.)

Sample No. 1-21

A single solvent of diethylene glycol isopropyl methyl ether (bp: 179° C.), which is the compound (n=2, the number of carbon atoms in $R_1$=3, the number of carbon atoms in $R_2$=1, the number of carbon atoms in $R_3$=2) represented by Formula (I)

Sample No. 1-22

A mixed solvent obtained by adding 10 parts by mass of the Sample no. 21 of the liquid medium to 90 parts by mass of 1,4-dimethylnaphthalene (bp: 268° C.)

Sample No. 1-23

A single solvent of diethylene glycol diethyl ether (bp: 188° C.), which is the compound (n=2, the number of carbon atoms in $R_1$=2, the number of carbon atoms in $R_2$=2, the number of carbon atoms in $R_3$=2) represented by Formula (I)

Sample No. 1-24

A mixed solvent obtained by adding 10 parts by mass of the Sample no. 23 of the liquid medium to 90 parts by mass of 1,4-dimethylnaphthalene (bp: 268° C.)

Sample No. 1-25

A single solvent of diethylene glycol butyl methyl ether (bp: 212° C.), which is the compound (n=2, the number of carbon atoms in $R_1$=4, the number of carbon atoms in $R_2$=1, the number of carbon atoms in $R_3$=2) represented by Formula (I)

Sample No. 1-26

A mixed solvent obtained by adding 10 parts by mass of the Sample no. 25 of the liquid medium to 90 parts by mass of 1,4-dimethylnaphthalene (bp: 268° C.)

Sample No. 1-27

A single solvent of diethylene glycol dibutyl ether (bp: 256° C.), which is the compound (n=2, the number of carbon atoms in $R_1$=4, the number of carbon atoms in $R_2$=4, the number of carbon atoms in $R_3$=2) represented by Formula (I)

Sample No. 1-28

A mixed solvent obtained by adding 10 parts by mass of the Sample no. 27 of the liquid medium to 90 parts by mass of 1,4-dimethylnaphthalene (bp: 268° C.)

Sample No. 1-29

A single solvent of dipropylene glycol dimethyl ether (bp: 171° C.), which is the compound (n=2, the number of carbon atoms in $R_1$=1, the number of carbon atoms in $R_2$=1, the number of carbon atoms in $R_3$=3) represented by Formula (I)

Sample No. 1-30

A mixed solvent obtained by adding 10 parts by mass of the Sample no. 29 of the liquid medium to 90 parts by mass of 1,4-dimethylnaphthalene (bp: 268° C.)

Sample No. 1-31

A single solvent of triethylene glycol dimethyl ether (bp: 216° C.), which is the compound (n=3, the number of carbon atoms in $R_1$=1, the number of carbon atoms in $R_2$=1, the number of carbon atoms in $R_3$=2) represented by Formula (I)

Sample No. 1-32

A mixed solvent obtained by adding 10 parts by mass of the Sample no. 31 of the liquid medium to 90 parts by mass of 1,4-dimethylnaphthalene (bp: 268° C.)

Sample No. 1-33

A single solvent of triethylene glycol ethyl methyl ether (bp: 225° C.), which is the compound (n=3, the number of carbon atoms in $R_1$=2, the number of carbon atoms in $R_2$=1, the number of carbon atoms in $R_3$=2) represented by Formula (I)

Sample No. 1-34

A mixed solvent obtained by adding 10 parts by mass of the Sample no. 33 of the liquid medium to 90 parts by mass of 1,4-dimethylnaphthalene (bp: 268° C.)

Sample No. 1-35

A single solvent of triethylene glycol butyl methyl ether (bp: 261° C.), which is the compound (n=3, the number of carbon atoms in $R_1$=4, the number of carbon atoms in $R_2$=1, the number of carbon atoms in $R_3$=2) represented by Formula (I)

Sample No. 1-36

A mixed solvent obtained by adding 10 parts by mass of the Sample no. 35 of the liquid medium to 90 parts by mass of 1,4-dimethylnaphthalene (bp: 268° C.)

Sample No. 1-37

A single solvent of tripropylene glycol dimethyl ether (bp: 215° C.), which is the compound (n=3, the number of carbon atoms in $R_1$=1, the number of carbon atoms in $R_2$=1, the number of carbon atoms in $R_3$=3) represented by Formula (I)

Sample No. 1-38

A mixed solvent obtained by adding 10 parts by mass of the Sample no. 37 of the liquid medium to 90 parts by mass of 1,4-dimethylnaphthalene (bp: 268° C.)

Sample No. 1-39

A single solvent of tetraethylene glycol dimethyl ether (bp: 275° C.), which is the compound (n=4, the number of carbon atoms in $R_1$=1, the number of carbon atoms in $R_2$=1, the number of carbon atoms in $R_3$=2) represented by Formula (I)

Sample No. 1-40

A mixed solvent obtained by adding 10 parts by mass of the Sample no. 39 of the liquid medium to 90 parts by mass of 1,4-dimethylnaphthalene (bp: 268° C.)

Sample No. 1-41

A single solvent of 1,4-dimethylnaphthalene

The above-described Samples of the liquid media are shown in Table 1.

TABLE 1-1

| | Liquid Medium | | | | | |
|---|---|---|---|---|---|---|
| | Ether Compound of Chem. 1 | | | | | |
| Sample No. | Content [wt %] | n | Number of Carbons in $R_1$ | Number of Carbons in $R_2$ | Number of Carbons in $R_3$ | Compound Other Than Chem. 1 |
| 1-1 | 10 | 0 | 2 | 2 | — | dimethylnaphthalene |
| 1-2 | 10 | 0 | 2 | 3 | — | dimethylnaphthalene |
| 1-3 | 10 | 0 | 3 (branched) | 3 (branched) | — | dimethylnaphthalene |
| 1-4 | 10 | 0 | 3 | 3 | — | dimethylnaphthalene |
| 1-5 | 100 | 0 | 5 (Cyclic) | 1 | — | — |
| 1-6 | 10 | 0 | 5 (Cyclic) | 1 | — | dimethylnaphthalene |

TABLE 1-1-continued

| | | Liquid Medium | | | | |
| | | Ether Compound of Chem. 1 | | | | |
| Sample No. | Content [wt %] | n | Number of Carbons in $R_1$ | Number of Carbons in $R_2$ | Number of Carbons in $R_3$ | Compound Other Than Chem. 1 |
|---|---|---|---|---|---|---|
| 1-7  | 100 | 0 | 4 | 4 | — | — |
| 1-8  | 10  | 0 | 4 | 4 | — | dimethylnaphthalene |
| 1-9  | 100 | 0 | 8 | 8 | — | — |
| 1-10 | 10  | 0 | 8 | 8 | — | dimethylnaphthalene |
| 1-11 | 100 | 1 | 1 | 1 | 2 | — |
| 1-12 | 10  | 1 | 1 | 1 | 2 | dimethylnaphthalene |
| 1-13 | 100 | 1 | 2 | 2 | 2 | — |
| 1-14 | 10  | 1 | 2 | 2 | 2 | dimethylnaphthalene |
| 1-15 | 100 | 1 | 4 | 4 | 2 | — |
| 1-16 | 10  | 1 | 4 | 4 | 2 | dimethylnaphthalene |
| 1-17 | 100 | 2 | 1 | 1 | 2 | — |
| 1-18 | 10  | 2 | 1 | 1 | 2 | dimethylnaphthalene |
| 1-19 | 100 | 2 | 2 | 1 | 2 | — |
| 1-20 | 10  | 2 | 2 | 1 | 2 | dimethylnaphthalene |
| 1-21 | 100 | 2 | 3 | 1 | 2 | — |
| 1-22 | 10  | 2 | 3 | 1 | 2 | dimethylnaphthalene |
| 1-23 | 100 | 2 | 2 | 2 | 2 | — |
| 1-24 | 10  | 2 | 2 | 2 | 2 | dimethylnaphthalene |
| 1-25 | 100 | 2 | 4 | 1 | 2 | — |
| 1-26 | 10  | 2 | 4 | 1 | 2 | dimethylnaphthalene |
| 1-27 | 100 | 2 | 4 | 4 | 2 | — |
| 1-28 | 10  | 2 | 4 | 4 | 2 | dimethylnaphthalene |
| 1-29 | 100 | 2 | 1 | 1 | 3 | — |
| 1-30 | 10  | 2 | 1 | 1 | 3 | dimethylnaphthalene |
| 1-31 | 100 | 3 | 1 | 1 | 2 | — |
| 1-32 | 10  | 3 | 1 | 1 | 2 | dimethylnaphthalene |
| 1-33 | 100 | 3 | 2 | 1 | 2 | — |
| 1-34 | 10  | 3 | 2 | 1 | 2 | dimethylnaphthalene |
| 1-35 | 100 | 3 | 4 | 1 | 2 | — |
| 1-36 | 10  | 3 | 4 | 1 | 2 | dimethylnaphthalene |
| 1-37 | 100 | 3 | 1 | 1 | 3 | — |
| 1-38 | 10  | 3 | 1 | 1 | 3 | dimethylnaphthalene |
| 1-39 | 100 | 4 | 1 | 1 | 2 | — |
| 1-40 | 10  | 4 | 1 | 1 | 2 | dimethylnaphthalene |
| 1-41 | 100 | — | — | — | — | dimethylnaphthalene |

2. Manufacture of Light Emitting Element

EXAMPLE 1

<1> First, a transparent glass substrate having an average thickness of 0.5 mm was prepared. Next, an ITO electrode (anode) having an average thickness of 100 nm was formed on the substrate with a sputtering method.

Then, the substrate was dipped in acetone and 2-propanol in this order, followed by washing with ultrasonic waves and oxygen plasma treatment.

<2> Next, a hole injection layer having an average thickness of 50 nm was formed on the ITO electrode.

This hole injection layer was formed by applying a hole-injection-layer-forming ink onto the ITO electrode with a liquid droplet discharge method and performing drying in a vacuum and heating (calcination) at 150° C. for 30 minutes in a nitrogen atmosphere.

For the preparation of the hole-injection-layer-forming ink, PEDOT/PSS (1/20) was used as the film-forming material; and a mixed dispersion medium, which included polystyrene sulfonic acid, 3,4-polyethylenedioxythiophene as a polythiophene derivative, and water, was used as the liquid medium (dispersion medium).

<3> Next, a hole transport layer having an average thickness of 50 nm was formed on the hole injection layer.

This hole transport layer was formed by applying a hole-transport-layer-forming ink (the film-forming ink according to the embodiment) onto the hole injection layer with a liquid droplet discharge method using the liquid droplet discharging device illustrated in FIG. 2 and performing drying in a vacuum and heating (calcination) at 180° C. for 1 hour in a nitrogen atmosphere. The obtained layer (hole transport layer) became unnecessary in an organic solvent.

For the preparation of the hole-transport-layer-forming ink, TFB (0.9 wt %) was used as the film-forming material; and the Sample No. 1-1 of the liquid medium (mixed solvent) was used as the liquid medium (solvent).

Such a film-forming ink can uniformly wet and be spread out on the hole injection layer when being applied thereto.

<4> Next, a red-light emitting layer (first light emitting layer) having an average thickness of 60 nm was formed on the hole transport layer.

This red-light emitting layer was formed by applying a red-light-emitting-layer-forming ink onto the hole transport layer with a liquid droplet discharge method and performing drying in a vacuum and heating (calcination) at 130° C. for 30 minutes.

For the preparation of the red-light-emitting-layer-forming ink, 1.4 wt % of the red phosphorescent material (host: polyvinylcarbazole (69%), PBD (29%), guest: bis(2-phenylpyridine)iridium (acetylacetonate) (2%)) was used as the film-forming material; and dimethylnaphthalene was used as the liquid medium (solvent).

<5> Next, a Ca layer having an average thickness of 10 nm and an Al layer having an average thickness of 200 nm were laminated on the red-light emitting layer in this order with a vacuum deposition method (vacuum degrees: $1.33 \times 10^{-4}$ Pa). As a result, a cathode including the laminate was formed.

Through the above-described processes, a light emitting element was manufactured.

EXAMPLES 1-2 to 1-40 and COMPARATIVE EXAMPLE 1-1

Light emitting elements were manufactured with the same method as that of Example 1, except that, when hole transport layers were formed, the Samples of the liquid media shown in Table 2 were used as the liquid solvent (solvent) instead of the Sample No. 1 of the liquid medium (mixed solvent).

hole injection layer with a liquid droplet discharge method using the liquid droplet discharging device illustrated in FIG. 2 and performing drying in a vacuum and heating (calcination) at 130° C. for 30 minutes in a nitrogen atmosphere.

For the preparation of the red-light-emitting-layer-forming ink, 1.4 wt % of the red phosphorescent material (host: polyvinylcarbazole (69%), PBD (29%), guest: bis(2-phenylpyridine)iridium (acetylacetonate) (2%)) was used as the film-forming material; and the Sample No. 1 of the liquid medium (mixed solvent) was used as the liquid medium (solvent).

Such a film-forming ink can uniformly wet and be spread out on the hole injection layer when being applied thereto.

TABLE 1-2

|  | Film-Forming Ink | | Evaluation | | |
|---|---|---|---|---|---|
|  | Film-Forming Material | Liquid Medium | Preservability | Light Emitting Efficiency | Lifetime (LT50) |
| Example 1-1 | Hole Transport Material | Sample No. 1 | B | 1.05 | 1.00 |
| Example 1-2 | Hole Transport Material | Sample No. 2 | B | 1.05 | 1.00 |
| Example 1-3 | Hole Transport Material | Sample No. 3 | B | 1.05 | 1.00 |
| Example 1-4 | Hole Transport Material | Sample No. 4 | B | 1.00 | 1.15 |
| Example 1-5 | Hole Transport Material | Sample No. 5 | B | 1.05 | 1.00 |
| Example 1-6 | Hole Transport Material | Sample No. 6 | B | 1.05 | 1.00 |
| Example 1-7 | Hole Transport Material | Sample No. 7 | B | 1.05 | 1.00 |
| Example 1-8 | Hole Transport Material | Sample No. 8 | B | 1.05 | 1.00 |
| Example 1-9 | Hole Transport Material | Sample No. 9 | B | 1.05 | 1.15 |
| Example 1-10 | Hole Transport Material | Sample No. 10 | B | 1.00 | 1.00 |
| Example 1-11 | Hole Transport Material | Sample No. 11 | B | 1.05 | 1.10 |
| Example 1-12 | Hole Transport Material | Sample No. 12 | B | 1.05 | 1.00 |
| Example 1-13 | Hole Transport Material | Sample No. 13 | B | 1.05 | 1.15 |
| Example 1-14 | Hole Transport Material | Sample No. 14 | B | 1.05 | 1.00 |
| Example 1-15 | Hole Transport Material | Sample No. 15 | B | 1.05 | 1.15 |
| Example 1-16 | Hole Transport Material | Sample No. 16 | B | 1.05 | 1.05 |
| Example 1-17 | Hole Transport Material | Sample No. 17 | A | 1.10 | 1.20 |
| Example 1-18 | Hole Transport Material | Sample No. 18 | A | 1.10 | 1.20 |
| Example 1-19 | Hole Transport Material | Sample No. 19 | A | 1.10 | 1.10 |
| Example 1-20 | Hole Transport Material | Sample No. 20 | A | 1.20 | 1.20 |
| Example 1-21 | Hole Transport Material | Sample No. 21 | A | 1.10 | 1.15 |
| Example 1-22 | Hole Transport Material | Sample No. 22 | A | 1.10 | 1.15 |
| Example 1-23 | Hole Transport Material | Sample No. 23 | A | 1.20 | 1.25 |
| Example 1-24 | Hole Transport Material | Sample No. 24 | A | 1.20 | 1.25 |
| Example 1-25 | Hole Transport Material | Sample No. 25 | A | 1.10 | 1.20 |
| Example 1-26 | Hole Transport Material | Sample No. 26 | A | 1.10 | 1.20 |
| Example 1-27 | Hole Transport Material | Sample No. 27 | A | 1.20 | 1.35 |
| Example 1-28 | Hole Transport Material | Sample No. 28 | A | 1.20 | 1.35 |
| Example 1-29 | Hole Transport Material | Sample No. 29 | A | 1.10 | 1.25 |
| Example 1-30 | Hole Transport Material | Sample No. 30 | A | 1.10 | 1.25 |
| Example 1-31 | Hole Transport Material | Sample No. 31 | A | 1.20 | 1.35 |
| Example 1-32 | Hole Transport Material | Sample No. 32 | A | 1.20 | 1.35 |
| Example 1-33 | Hole Transport Material | Sample No. 33 | A | 1.20 | 1.15 |
| Example 1-34 | Hole Transport Material | Sample No. 34 | A | 1.20 | 1.15 |
| Example 1-35 | Hole Transport Material | Sample No. 35 | A | 1.20 | 1.15 |
| Example 1-36 | Hole Transport Material | Sample No. 36 | A | 1.20 | 1.15 |
| Example 1-37 | Hole Transport Material | Sample No. 37 | A | 1.20 | 1.20 |
| Example 1-38 | Hole Transport Material | Sample No. 38 | A | 1.20 | 1.20 |
| Example 1-39 | Hole Transport Material | Sample No. 39 | A | 1.20 | 1.35 |
| Example 1-40 | Hole Transport Material | Sample No. 40 | A | 1.20 | 1.35 |
| Comparative Example 1-1 | Hole Transport Material | Sample No. 41 | C | 1.00 | 1.00 |

EXAMPLE 1-41

A light emitting element was manufactured with the same method as that of Example 1, except that a hole transport layer was not provided and a method of forming a red-light emitting layer was different.

In this embodiment, the red-light emitting layer was formed by applying a red-light-emitting-layer-forming ink (the film-forming ink according to the embodiment) onto the

EXAMPLES 1-42 to 1-80 and COMPARATIVE EXAMPLE 1-2

Light emitting elements were manufactured with the same method as that of Example 27, except that, when red-light emitting layers were formed, the Samples of the liquid media shown in Table 3 were used as the liquid solvent (solvent) instead of the Sample No. 1 of the liquid medium (mixed solvent).

TABLE 1-3

| | Film-Forming Ink | | Evaluation | | |
| --- | --- | --- | --- | --- | --- |
| | Film-Forming Material | Liquid Medium | Preservability | Light Emitting Efficiency | Lifetime (LT50) |
| Example 1-41 | Light Emitting Material | Sample No. 1 | B | 1.05 | 1.00 |
| Example 1-42 | Light Emitting Material | Sample No. 2 | B | 1.05 | 1.00 |
| Example 1-43 | Light Emitting Material | Sample No. 3 | B | 1.05 | 1.00 |
| Example 1-44 | Light Emitting Material | Sample No. 4 | B | 1.00 | 1.15 |
| Example 1-45 | Light Emitting Material | Sample No. 5 | B | 1.05 | 1.00 |
| Example 1-46 | Light Emitting Material | Sample No. 6 | B | 1.05 | 1.00 |
| Example 1-47 | Light Emitting Material | Sample No. 7 | B | 1.05 | 1.00 |
| Example 1-48 | Light Emitting Material | Sample No. 8 | B | 1.05 | 1.00 |
| Example 1-49 | Light Emitting Material | Sample No. 9 | B | 1.05 | 1.15 |
| Example 1-50 | Light Emitting Material | Sample No. 10 | B | 1.10 | 1.00 |
| Example 1-51 | Light Emitting Material | Sample No. 11 | B | 1.05 | 1.10 |
| Example 1-52 | Light Emitting Material | Sample No. 12 | B | 1.10 | 1.10 |
| Example 1-53 | Light Emitting Material | Sample No. 13 | B | 1.05 | 1.15 |
| Example 1-54 | Light Emitting Material | Sample No. 14 | B | 1.10 | 1.15 |
| Example 1-55 | Light Emitting Material | Sample No. 15 | B | 1.05 | 1.15 |
| Example 1-56 | Light Emitting Material | Sample No. 16 | B | 1.20 | 1.15 |
| Example 1-57 | Light Emitting Material | Sample No. 17 | A | 1.10 | 1.40 |
| Example 1-58 | Light Emitting Material | Sample No. 18 | A | 1.10 | 1.45 |
| Example 1-59 | Light Emitting Material | Sample No. 19 | A | 1.10 | 1.50 |
| Example 1-60 | Light Emitting Material | Sample No. 20 | A | 1.10 | 1.25 |
| Example 1-61 | Light Emitting Material | Sample No. 21 | A | 1.10 | 1.35 |
| Example 1-62 | Light Emitting Material | Sample No. 22 | A | 1.10 | 1.35 |
| Example 1-63 | Light Emitting Material | Sample No. 23 | A | 1.20 | 1.40 |
| Example 1-64 | Light Emitting Material | Sample No. 24 | A | 1.20 | 1.45 |
| Example 1-65 | Light Emitting Material | Sample No. 25 | A | 1.10 | 1.40 |
| Example 1-66 | Light Emitting Material | Sample No. 26 | A | 1.10 | 1.40 |
| Example 1-67 | Light Emitting Material | Sample No. 27 | A | 1.20 | 2.00 |
| Example 1-68 | Light Emitting Material | Sample No. 28 | A | 1.20 | 1.80 |
| Example 1-69 | Light Emitting Material | Sample No. 29 | A | 1.10 | 1.75 |
| Example 1-70 | Light Emitting Material | Sample No. 30 | A | 1.10 | 1.60 |
| Example 1-71 | Light Emitting Material | Sample No. 31 | A | 1.20 | 1.85 |
| Example 1-72 | Light Emitting Material | Sample No. 32 | A | 1.20 | 1.80 |
| Example 1-73 | Light Emitting Material | Sample No. 33 | A | 1.20 | 1.55 |
| Example 1-74 | Light Emitting Material | Sample No. 34 | A | 1.20 | 1.35 |
| Example 1-75 | Light Emitting Material | Sample No. 35 | A | 1.20 | 1.45 |
| Example 1-76 | Light Emitting Material | Sample No. 36 | A | 1.20 | 1.30 |
| Example 1-77 | Light Emitting Material | Sample No. 37 | A | 1.20 | 1.90 |
| Example 1-78 | Light Emitting Material | Sample No. 38 | A | 1.20 | 1.75 |
| Example 1-79 | Light Emitting Material | Sample No. 39 | A | 1.20 | 1.80 |
| Example 1-80 | Light Emitting Material | Sample No. 40 | A | 1.20 | 1.70 |
| Comparative Example 1-2 | Light Emitting Material | Sample No. 41 | C | 1.00 | 1.00 |

3. Evaluation

Evaluation of Preservability (Ink Preservation Stability)

With regard to the respective Examples and Comparative Examples, a film-forming ink used for forming a film (a hole transport layer or a red-light emitting layer) on a hole injection layer was stored at room temperature for 3 months, and the state of the film-forming ink after the storage was observed and evaluated based on the following evaluation criteria.

A: Gelation and an increase in viscosity were not observed

B: Small amounts of gelation and increase in viscosity were observed but were in a range where there were no problems in practice C: Significant amounts of gelation and increase in viscosity were observed Evaluation of Light Emitting Efficiency With regard to light emitting elements of the respective Examples and Comparative Examples, a constant current of 10 mA/cm$^2$ was applied to a light emitting element using a DC power supply. At this time, the luminance was measured using a luminance meter and the light emitting efficiency (luminance/current density) was evaluated. With regard to Examples 1-1 to 1-40 and Comparative Example 1-1, light emitting efficiency was normalized based on Comparative Examples 1-1 for evaluation, and with regard to Example 1-41 to 1-80 and Comparative Example 1-2, light emitting efficiency was normalized based on Comparative Example 1-2 for evaluation.

Evaluation of Emission Lifetime

With regard to light emitting elements of the respective Examples and Comparative Examples, a constant current of 100 mA/cm$^2$ was continuously applied to a light emitting element using a DC power supply, while a luminance was measured using a luminance meter. The time (LT50) when the luminance was 50% of the initial luminance, was measured. With regard to Examples 1-1 to 1-40 and Comparative Example 1-1, emission lifetime was normalized based on Comparative Example 1-1 for evaluation, and with regard to Examples 1-41 to 1-80 and Comparative Example 1-2, emission lifetime was normalized based on Comparative Example 1-2 for evaluation.

These evaluation results are shown in Tables 2 and 3.

As clearly shown in Tables 2 and 3, when the respective Examples are compared to the Comparative Examples, superior evaluation results are obtained in all the evaluation of ink preservation stability, light emitting efficiency, and emission lifetime.

In particular, in Examples 1-17 to 1-40 and 1-57 to 1-80, ink preservation stability was very superior. The reason is considered to be that the aliphatic ether compound included in the liquid medium of the film-forming ink has a large effect of alleviating the effects of π-π stacking between hole transport materials or between light emitting materials.

EXAMPLE 2

1. Preparation of Liquid Medium

The following Samples No. 2-1 to No. 2-27 of the liquid medium (solvent) were prepared.

Sample No. 2-1

A mixed solvent obtained by adding ethylene glycol dimethyl ether (bp: 85° C., surface tension: 23 dyn/cm), which is the compound (n=1, the number of carbon atoms in $R_1$=1, the number of carbon atoms in $R_2$=1, the number of carbon atoms in $R_3$=2) represented by Formula (I), to dimethylnaphthalene (bp: 268° C., surface tension: 37 dyn/cm) such that the surface tension is 35 dyn/cm Sample No. 2-2

A single solvent of diethylene glycol dimethyl ether (bp: 162° C., surface tension: 28 dyn/cm), which is the compound (n=2, the number of carbon atoms in $R_1$=1, the number of carbon atoms in $R_2$=1, the number of carbon atoms in $R_3$=2) represented by Formula (I)

Sample No. 2-3

A mixed solvent obtained by adding the Sample No. 2 of the liquid medium to dimethylnaphthalene such that the surface tension is 35 dyn/cm Sample No. 2-4

A single solvent of diethylene glycol ethyl methyl ether (bp: 176° C., surface tension: 27 dyn/cm), which is the compound (n=2, the number of carbon atoms in $R_1$=2, the number of carbon atoms in $R_2$=1, the number of carbon atoms in $R_3$=2) represented by Formula (I)

Sample No. 2-5

A mixed solvent obtained by adding the Sample No. 4 of the liquid medium to dimethylnaphthalene such that the surface tension is 35 dyn/cm Sample No. 2-6

A single solvent of diethylene glycol isopropyl methyl ether (bp: 179° C., surface tension: 24 dyn/cm), which is the compound (n=2, the number of carbon atoms in $R_1$=3, the number of carbon atoms in $R_2$=1, the number of carbon atoms in $R_3$=2) represented by Formula (I)

Sample No. 2-7

A mixed solvent obtained by adding the Sample No. 6 of the liquid medium to dimethylnaphthalene such that the surface tension is 35 dyn/cm Sample No. 2-8

A single solvent of diethylene glycol diethyl ether (bp: 188° C., surface tension: 30 dyn/cm), which is the compound (n=2, the number of carbon atoms in $R_1$=2, the number of carbon atoms in $R_2$=2, the number of carbon atoms in $R_3$=2) represented by Formula (I)

Sample No. 2-9

A mixed solvent obtained by adding the Sample No. 8 of the liquid medium to dimethylnaphthalene such that the surface tension is 35 dyn/cm Sample No. 2-10

A single solvent of diethylene glycol butyl methyl ether (bp: 212° C., surface tension: 24 dyn/cm), which is the compound (n=2, the number of carbon atoms in $R_1$=4, the number of carbon atoms in $R_2$=1, the number of carbon atoms in $R_3$=2) represented by Formula (I)

Sample No. 2-11

A mixed solvent obtained by adding the Sample No. 10 of the liquid medium to dimethylnaphthalene such that the surface tension is 35 dyn/cm Sample No. 2-12

A single solvent of diethylene glycol dibutyl ether (bp: 256° C., surface tension: 25 dyn/cm), which is the compound (n=2, the number of carbon atoms in $R_1$=4, the number of carbon atoms in $R_2$=4, the number of carbon atoms in $R_3$=2) represented by Formula (I)

Sample No. 2-13

A mixed solvent obtained by adding the Sample No. 12 of the liquid medium to dimethylnaphthalene such that the surface tension is 35 dyn/cm Sample No. 2-14

A single solvent of dipropylene glycol dimethyl ether (bp: 171° C., surface tension: 26 dyn/cm), which is the compound (n=2, the number of carbon atoms in $R_1$=1, the number of carbon atoms in $R_2$=1, the number of carbon atoms in $R_3$=3) represented by Formula (I)

Sample No. 2-15

A mixed solvent obtained by adding the Sample No. 14 of the liquid medium to dimethylnaphthalene such that the surface tension is 35 dyn/cm Sample No. 2-16

A single solvent of triethylene glycol dimethyl ether (bp: 216° C., surface tension: 31 dyn/cm), which is the compound (n=3, the number of carbon atoms in $R_1$=1, the number of carbon atoms in $R_2$=1, the number of carbon atoms in $R_3$=2) represented by Formula (I)

Sample No. 2-17

A mixed solvent obtained by adding the Sample No. 16 of the liquid medium to dimethylnaphthalene such that the surface tension is 35 dyn/cm Sample No. 2-18

A single solvent of triethylene glycol ethyl methyl ether (bp: 225° C., surface tension: 29 dyn/cm), which is the compound (n=3, the number of carbon atoms in $R_1$=2, the number of carbon atoms in $R_2$=1, the number of carbon atoms in $R_3$=2) represented by Formula (I)

Sample No. 2-19

A mixed solvent obtained by adding the Sample No. 18 of the liquid medium to dimethylnaphthalene such that the surface tension is 35 dyn/cm Sample No. 2-20

A single solvent of triethylene glycol butyl methyl ether (bp: 261° C., surface tension: 28 dyn/cm), which is the compound (n=3, the number of carbon atoms in $R_1$=4, the number of carbon atoms in $R_2$=1, the number of carbon atoms in $R_3$=2) represented by Formula (I)

Sample No. 2-21

A mixed solvent obtained by adding the Sample No. 20 of the liquid medium to dimethylnaphthalene such that the surface tension is 35 dyn/cm Sample No. 2-22

A single solvent of tripropylene glycol dimethyl ether (bp: 215° C., surface tension: 26 dyn/cm), which is the compound (n=3, the number of carbon atoms in $R_1$=1, the number of carbon atoms in $R_2$=1, the number of carbon atoms in $R_3$=3) represented by Formula (I)

Sample No. 2-23

A mixed solvent obtained by adding the Sample No. 22 of the liquid medium to dimethylnaphthalene such that the surface tension is 35 dyn/cm Sample No. 2-24

A single solvent of tetraethylene glycol dimethyl ether (bp: 275° C., surface tension: 33 dyn/cm), which is the compound (n=4, the number of carbon atoms in $R_1$=1, the number of carbon atoms in $R_2$=1, the number of carbon atoms in $R_3$=2) represented by Formula (I)

Sample No. 2-25

A mixed solvent obtained by adding the Sample No. 24 of the liquid medium to dimethylnaphthalene such that the surface tension is 35 dyn/cm Sample No. 2-26

A single solvent of dimethylnaphthalene

Sample No. 2-27

A mixed solvent obtained by adding the Sample No. 24 of the liquid medium to dimethylnaphthalene such that the surface tension is 36 dyn/cm The above-described Samples of the liquid media are shown in Table 2-1.

TABLE 2-1

| | Liquid Medium | | | | |
|---|---|---|---|---|---|
| | | Ether Compound of Chem. 1 | | | |
| Sample No. | Surface Tension [dyn/cm] | n | Number of Carbons in $R_1$ | Number of Carbons in $R_2$ | Number of Carbons in $R_3$ | Compound Other Than Chem. 1 |
| 2-1 | 35 | 1 | 1 | 1 | 2 | dimethylnaphthalene |
| 2-2 | 28 | 2 | 1 | 1 | 2 | — |
| 2-3 | 35 | 2 | 1 | 1 | 2 | dimethylnaphthalene |
| 2-4 | 27 | 2 | 2 | 1 | 2 | — |
| 2-5 | 35 | 2 | 2 | 1 | 2 | dimethylnaphthalene |
| 2-6 | 24 | 2 | 3 | 1 | 2 | — |
| 2-7 | 35 | 2 | 3 | 1 | 2 | dimethylnaphthalene |
| 2-8 | 30 | 2 | 2 | 2 | 2 | — |
| 2-9 | 35 | 2 | 2 | 2 | 2 | dimethylnaphthalene |
| 2-10 | 24 | 2 | 4 | 1 | 2 | — |
| 2-11 | 35 | 2 | 4 | 1 | 2 | dimethylnaphthalene |
| 2-12 | 25 | 2 | 4 | 4 | 2 | — |
| 2-13 | 35 | 2 | 4 | 4 | 2 | dimethylnaphthalene |
| 2-14 | 26 | 2 | 1 | 1 | 3 | — |
| 2-15 | 35 | 2 | 1 | 1 | 3 | dimethylnaphthalene |
| 2-16 | 31 | 3 | 1 | 1 | 2 | — |
| 2-17 | 35 | 3 | 1 | 1 | 2 | dimethylnaphthalene |
| 2-18 | 29 | 3 | 2 | 1 | 2 | — |
| 2-19 | 35 | 3 | 2 | 1 | 2 | dimethylnaphthalene |
| 2-20 | 28 | 3 | 4 | 1 | 2 | — |
| 2-21 | 35 | 3 | 4 | 1 | 2 | dimethylnaphthalene |
| 2-22 | 26 | 3 | 1 | 1 | 3 | — |
| 2-23 | 35 | 3 | 1 | 1 | 3 | dimethylnaphthalene |
| 2-24 | 33 | 4 | 1 | 1 | 2 | — |
| 2-25 | 35 | 4 | 1 | 1 | 2 | dimethylnaphthalene |
| 2-26 | 37 | — | — | — | — | dimethylnaphthalene |
| 2-27 | 35 | 4 | 1 | 1 | 2 | dimethylnaphthalene |

2. Manufacture of Light Emitting Element

EXAMPLE 2-1

<1> First, a transparent glass substrate having an average thickness of 0.5 mm was prepared. Next, an ITO electrode (anode) having an average thickness of 100 nm was formed on the substrate with a sputtering method.

Then, the substrate was dipped in acetone and 2-propanol in this order, followed by washing with ultrasonic waves and oxygen plasma treatment.

<2> Next, a hole injection layer having an average thickness of 50 nm was formed on the ITO electrode.

This hole injection layer was formed by applying a hole-injection-layer-forming ink onto the ITO electrode with a liquid droplet discharge method and performing drying in a vacuum and heating (calcination) at 150° C. for 30 minutes in a nitrogen atmosphere.

For the preparation of the hole-injection-layer-forming ink, PEDOT/PSS (1/20) was used as the film-forming material; and a mixed dispersion medium, which includes polystyrene sulfonic acid, 3,4-polyethylenedioxythiophene as a polythiophene derivative, and water, was used as the liquid medium (dispersion medium).

<3> Next, a hole transport layer having an average thickness of 50 nm was formed on the hole injection layer.

This hole transport layer was formed by applying a hole-transport-layer-forming ink (the film-forming ink according to the embodiment) onto the hole injection layer with a liquid droplet discharge method using the liquid droplet discharging device illustrated in FIG. 2 and performing drying in a vacuum and heating (calcination) at 180° C. for 1 hour in a nitrogen atmosphere. The obtained layer (hole transport layer) became unnecessary in an organic solvent.

For the preparation of the hole-transport-layer-forming ink, TFB (0.9 wt %) was used as the film-forming material; and the Sample No. 2-1 of the liquid medium (mixed solvent) was used as the liquid medium (solvent).

Such a film-forming ink can uniformly wet and be spread out on the hole injection layer when being applied thereto.

<4> Next, a red-light emitting layer (first light emitting layer) having an average thickness of 60 nm was formed on the hole transport layer.

This red-light emitting layer was formed by applying a red-light-emitting-layer-forming ink onto the hole transport layer with a liquid droplet discharge method and performing drying in a vacuum and heating (calcination) at 130° C. for 30 minutes.

For the preparation of the red-light-emitting-layer-forming ink, diindenoperylene (1.5 wt %), which is the red-light emitting material, was used as the film-forming material; and dimethylnaphthalene was used as the liquid medium (solvent).

<5> Next, a Ca layer having an average thickness of 10 nm and an Al layer having an average thickness of 200 nm were laminated on the red-light emitting layer in this order with a vacuum deposition method (vacuum degrees: $1.33 \times 10^{-4}$ Pa). As a result, a cathode including the laminate was formed.

Through the above-described processes, a light emitting element was manufactured.

EXAMPLES 2-2 to 2-25 and COMPARATIVE EXAMPLES 2-1 and 2-2

Light emitting elements were manufactured with the same method as that of Example 2-1, except that, when hole transport layers were formed, the Samples of the liquid media shown in Table 2-2 were used as the liquid solvent (solvent) instead of the Sample No. 2-1 of the liquid medium (mixed solvent).

(the film-forming ink according to the embodiment) onto the hole injection layer with a liquid droplet discharge method using the liquid droplet discharging device illustrated in FIG. 2 and performing drying in a vacuum and heating (calcination) at 130° C. for 30 minutes in a nitrogen atmosphere.

For the preparation of the red-light-emitting-layer-forming ink, diindenoperylene (1.5 wt %), which is the red-light emitting material, was used as the film-forming material; and the Sample 2-1 of the liquid medium (mixed solvent) was used as the liquid medium (solvent).

Such a film-forming ink can uniformly wet and be spread out on the hole injection layer when being applied thereonto.

TABLE 2-2

|  | Film-Forming Ink | | Evaluation | | |
|---|---|---|---|---|---|
|  | Film-Forming Material | Liquid Medium | Wettability | Emission State | Light Emitting Efficiency |
| Example 2-1 | Hole Transport Material | Sample No. 1 | A | A | 0.7 |
| Example 2-2 | Hole Transport Material | Sample No. 2 | A | A | 1 |
| Example 2-3 | Hole Transport Material | Sample No. 3 | A | A | 1 |
| Example 2-4 | Hole Transport Material | Sample No. 4 | A | A | 1 |
| Example 2-5 | Hole Transport Material | Sample No. 5 | A | A | 1 |
| Example 2-6 | Hole Transport Material | Sample No. 6 | A | A | 1 |
| Example 2-7 | Hole Transport Material | Sample No. 7 | A | A | 1 |
| Example 2-8 | Hole Transport Material | Sample No. 8 | A | A | 1 |
| Example 2-9 | Hole Transport Material | Sample No. 9 | A | A | 1 |
| Example 2-10 | Hole Transport Material | Sample No. 10 | A | A | 1 |
| Example 2-11 | Hole Transport Material | Sample No. 11 | A | A | 1 |
| Example 2-12 | Hole Transport Material | Sample No. 12 | A | A | 1 |
| Example 2-13 | Hole Transport Material | Sample No. 13 | A | A | 1 |
| Example 2-14 | Hole Transport Material | Sample No. 14 | A | A | 1 |
| Example 2-15 | Hole Transport Material | Sample No. 15 | A | A | 1 |
| Example 2-16 | Hole Transport Material | Sample No. 16 | A | A | 1 |
| Example 2-17 | Hole Transport Material | Sample No. 17 | A | A | 1 |
| Example 2-18 | Hole Transport Material | Sample No. 18 | A | A | 1 |
| Example 2-19 | Hole Transport Material | Sample No. 19 | A | A | 1 |
| Example 2-20 | Hole Transport Material | Sample No. 20 | A | A | 1 |
| Example 2-21 | Hole Transport Material | Sample No. 21 | A | A | 1 |
| Example 2-22 | Hole Transport Material | Sample No. 22 | A | A | 1 |
| Example 2-23 | Hole Transport Material | Sample No. 23 | A | A | 1 |
| Example 2-24 | Hole Transport Material | Sample No. 24 | A | A | 1 |
| Example 2-25 | Hole Transport Material | Sample No. 25 | A | A | 1 |
| Comparative Example 2-1 | Hole Transport Material | Sample No. 26 | C | C | 1 |
| Comparative Example 2-2 | Hole Transport Material | Sample No. 27 | C | C | 1 |

EXAMPLE 2-26

A light emitting element was manufactured with the same method as that of Example 1, except that a hole transport layer was not provided and a method of forming a red-light emitting layer was different.

In this embodiment, the red-light emitting layer was formed by applying a red-light-emitting-layer-forming ink EXAMPLES 2-27 to 2-50 and COMPARATIVE EXAMPLE 2-3 and 2-4

Light emitting elements were manufactured with the same method as that of Example 2-27, except that, when red-light emitting layers were formed, the Samples of the liquid media shown in Table 2-3 were used as the liquid solvent (solvent) instead of the Sample No. 2-1 of the liquid medium (mixed solvent).

TABLE 2-3

|  | Film-Forming Ink | | Evaluation | | |
|---|---|---|---|---|---|
|  | Film-Forming Material | Liquid Medium | Wettability | Emission State | Light Emitting Efficiency |
| Example 2-26 | Light Emitting Material | Sample No. 1 | A | A | 0.5 |
| Example 2-27 | Light Emitting Material | Sample No. 2 | A | A | 1 |

TABLE 2-3-continued

| | Film-Forming Ink | | Evaluation | | |
| | Film-Forming Material | Liquid Medium | Wettability | Emission State | Light Emitting Efficiency |
|---|---|---|---|---|---|
| Example 2-28 | Light Emitting Material | Sample No. 3 | A | A | 1 |
| Example 2-29 | Light Emitting Material | Sample No. 4 | A | A | 1 |
| Example 2-30 | Light Emitting Material | Sample No. 5 | A | A | 1 |
| Example 2-31 | Light Emitting Material | Sample No. 6 | A | A | 1 |
| Example 2-32 | Light Emitting Material | Sample No. 7 | A | A | 1 |
| Example 2-33 | Light Emitting Material | Sample No. 8 | A | A | 1 |
| Example 2-34 | Light Emitting Material | Sample No. 9 | A | A | 1 |
| Example 2-35 | Light Emitting Material | Sample No. 10 | A | A | 1 |
| Example 2-36 | Light Emitting Material | Sample No. 11 | A | A | 1 |
| Example 2-37 | Light Emitting Material | Sample No. 12 | A | A | 1 |
| Example 2-38 | Light Emitting Material | Sample No. 13 | A | A | 1 |
| Example 2-39 | Light Emitting Material | Sample No. 14 | A | A | 1 |
| Example 2-40 | Light Emitting Material | Sample No. 15 | A | A | 1 |
| Example 2-41 | Light Emitting Material | Sample No. 16 | A | A | 1 |
| Example 2-42 | Light Emitting Material | Sample No. 17 | A | A | 1 |
| Example 2-43 | Light Emitting Material | Sample No. 18 | A | A | 1 |
| Example 2-44 | Light Emitting Material | Sample No. 19 | A | A | 1 |
| Example 2-45 | Light Emitting Material | Sample No. 20 | A | A | 1 |
| Example 2-46 | Light Emitting Material | Sample No. 21 | A | A | 1 |
| Example 2-47 | Light Emitting Material | Sample No. 22 | A | A | 1 |
| Example 2-48 | Light Emitting Material | Sample No. 23 | A | A | 1 |
| Example 2-49 | Light Emitting Material | Sample No. 24 | A | A | 1 |
| Example 2-50 | Light Emitting Material | Sample No. 25 | A | A | 1 |
| Comparative Example 2-3 | Light Emitting Material | Sample No. 26 | C | C | 1 |
| Comparative Example 2-4 | Light Emitting Material | Sample No. 27 | C | C | 1 |

3. Evaluation

Evaluation of Wettability

Light emitting elements of the respective Examples and Comparative Examples were manufactured and evaluated for the wettability of the film-forming ink, used for forming a hole transport layer or a red-light emitting layer, on a lower layer (on a hole injection layer). Satisfactory results were set as "A" and unsatisfactory results were set as "C".

Evaluation of Emission State

With regard to light emitting elements of the respective Examples and Comparative Examples, a current having a current density of 30 mA/cm$^2$ was applied between an anode and a cathode using a DC power supply and the emission state of a light emitting element was observed and evaluated based on the following evaluation criteria.

A: light was uniformly emitted without unevenness

C: There were relatively many portions which were not illuminated with light and light was emitted with unevenness Evaluation of Light Emitting Efficiency With regard to light emitting elements of the respective Examples and Comparative Examples, a constant current of 30 mA/cm$^2$ was applied to a light emitting element using a DC power supply. At this time, the luminance was measured using a luminance meter and the light emitting efficiency (luminance/current density) was evaluated. With regard to Examples 2-1 to 2-27 and Comparative Examples 2-1 and 2-2, light emitting efficiency was normalized based on Comparative Example 2-1 for evaluation, and with regard to Examples 2-28 to 2-50 and Comparative Examples 2-3 and 2-4, light emitting efficiency was normalized based on Comparative Example 2-3 for evaluation.

These evaluation results are shown in Tables 2-2 and 2-3.

As clearly shown in Tables 2-2 and 2-3, in the respective Examples, the wettability of the film-forming ink on the hole injection layer is satisfactory and furthermore a time required for the application of the film-forming ink can be reduced. In addition, in the light emitting elements of the respective Examples, light can be emitted uniformly and satisfactorily.

On the other hand, in the respective Comparative Examples, the wettability of the film-forming ink on the hole injection layer is poor and furthermore a time required for the application of the film-forming ink increases. In addition, in the light emitting elements of the respective Comparative Examples, light is emitted nonuniformly.

In addition, in the above-described respective Examples, light emitting elements were manufactured in the same manner using, as the constituent material of the hole injection layer, a polypyrrole derivative, a polyaniline derivative, sulfonated polyaniline (SPAN), and a triphenylamine derivative, respectively, instead of PEDOT. In all of the light emitting elements, the wettability of the film-forming ink on the hole injection layer was satisfactory.

In addition, in the above-described respective Examples, light emitting elements were manufactured in the same manner using, as the constituent material of the hole injection layer, Nafion (trade mark), respectively, instead of PSS. In all of the light emitting elements, the wettability of the film-forming ink on the hole injection layer was satisfactory.

In addition, in the above-described respective Examples, light emitting elements were manufactured in the same manner without using PSS which is the constituent material of the hole injection layer, respectively. In all of the light emitting elements, the wettability of the film-forming ink on the hole injection layer was satisfactory.

The entire disclosure of Japanese Patent Application No. 2011-278881, filed Dec. 20, 2012 and Application No. 2011-278882, filed Dec. 20, 2012 are expressly incorporated by reference herein.

What is claimed is:

1. A film-forming ink, comprising:
   a film-forming material that comprises a semiconductor or a metal; and a liquid medium which dissolves or disperses the film-forming material,
wherein the liquid medium has a surface tension of 35 dyn/cm or less and a viscosity of less than or equal to 2 cP at normal temperature, and contains an aromatic hydrocarbon compound and an ether compound represented by Formula (I):

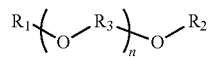
(I)

wherein in Formula (I), $R_1$ and $R_2$ each independently represent a linear alkyl group, a branched alkyl group, or a cyclic alkyl group which has 1 to 4 carbon atoms, $R_3$ represents an alkylene group having 1 to 3 carbon atoms, and n =2 to 4.

2. The film-forming ink according to claim 1, wherein in Formula (I), the number of carbon atoms in $R_3$ is 2 or 3.

3. The film-forming ink according to claim 1, wherein a content of the ether compound in the liquid medium is 0.1 wt % to 20 wt %.

4. The film-forming ink according to claim 1, wherein the film-forming material contains a π-conjugated compound.

5. The film-forming ink according to claim 1, wherein the film-forming material contains a metal complex.

6. The film-forming ink according to claim 1, wherein the film-forming material is soluble in a non-aqueous solvent.

7. The film-forming ink according to claim 6, wherein the film-forming material is a material constituting an organic layer of an organic electroluminescence element, or a precursor thereof.

8. A film-forming method comprising:
applying the film-forming ink according to claim 1 to a substrate; and
removing the liquid medium from the film-forming ink to form a film.

9. A film-forming method comprising:
applying the film-forming ink according to claim 2 to a substrate; and
removing the liquid medium from the film-forming ink to form a film.

10. A method of manufacturing a light emitting element comprising:
applying the film-forming ink according to claim 1 to a substrate; and
removing the liquid medium from the film-forming ink to form an organic layer.

11. The film-forming ink according to claim 1 having a viscosity of 1 cP to 5 cP.

12. A film-forming ink, comprising:
a film-forming material that comprises a semiconductor or a metal; and
a liquid medium which dissolves or disperses the film-forming material,
wherein the liquid medium has a surface tension of 35 dyn/cm or less and a viscosity of less than or equal to 2 cP at normal temperature, and contains an ether compound represented by Formula (I):

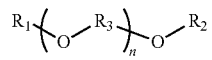
(I)

where in Formula (I), $R_1$ and $R_2$ each independently represent a linear alkyl group, a branched alkyl group, or a cyclic alkyl group which has 1 to 4 carbon atoms, $R_3$ represents an alkylene group having 1 carbon atom, and n represents an integer of 2 to 4.

* * * * *